(12) United States Patent
Nakagawa et al.

(10) Patent No.: US 10,867,617 B1
(45) Date of Patent: Dec. 15, 2020

(54) TECHNIQUES FOR PROCESSING AUDIO DATA

(71) Applicant: Amazon Technologies, Inc., Seattle, WA (US)

(72) Inventors: Carlos Renato Nakagawa, San Jose, CA (US); Carlo Murgia, Santa Clara, CA (US); Wai Chung Chu, San Jose, CA (US); Kuan-Chieh Yen, Foster City, CA (US)

(73) Assignee: Amazon Technologies, Inc., Seattle, WA (US)

( * ) Notice: Subject to any disclaimer, the term of this patent is extended or adjusted under 35 U.S.C. 154(b) by 115 days.

(21) Appl. No.: 16/215,217

(22) Filed: Dec. 10, 2018

(51) Int. Cl.
| | |
|---|---|
| *G10L 21/0224* | (2013.01) |
| *G10L 21/0264* | (2013.01) |
| *H04R 3/04* | (2006.01) |
| *G10L 21/034* | (2013.01) |
| *G10L 21/0208* | (2013.01) |

(52) U.S. Cl.
CPC ...... *G10L 21/0224* (2013.01); *G10L 21/0264* (2013.01); *G10L 21/034* (2013.01); *H04R 3/04* (2013.01); *G10L 2021/02082* (2013.01)

(58) Field of Classification Search
CPC ............ G10L 21/0224; G10L 21/0264; G10L 21/034; G10L 2021/02082; H04R 3/04
USPC ......................................................... 704/226
See application file for complete search history.

(56) References Cited

U.S. PATENT DOCUMENTS

| | | | | |
|---|---|---|---|---|
| 2014/0105410 | A1* | 4/2014 | Zhan ................... | G10K 11/175 381/66 |
| 2015/0364145 | A1* | 12/2015 | Keller ................ | G10L 21/0208 704/205 |

FOREIGN PATENT DOCUMENTS

JP 2008172484 A * 7/2008 .............. H04M 1/60

* cited by examiner

*Primary Examiner* — Quynh H Nguyen
(74) *Attorney, Agent, or Firm* — Lee & Hayes, P.C.

(57) ABSTRACT

This disclosure describes, in part, techniques for processing audio data. For instance, an electronic device may include an automatic gain controller (AGC) that determines AGC gains for amplifying or attenuating an audio data. To determine the AGC gains, the AGC uses information from a residual echo suppressor (RES) and/or a noise reductor (NR). The information may indicate RES gains applied to the audio data by the RES and/or NR gains applied to the audio data by the NR. In some instances, to determine the AGC gain, the AGC determines time-constant parameter(s) using the information. The AGC then uses the time-constant parameter(s) to determine an input signal level for the audio data and/or the AGC gain. In some instances, to determine the AGC gain, the AGC operates in an attack mode or a release mode based on the information.

20 Claims, 10 Drawing Sheets

TECHNIQUES FOR PROCESSING AUDIO DATA

BACKGROUND

Some electronic devices allow users to communicate using speech. For example, an electronic device may generate an audio data representing speech from a user and may then send the audio data to another electronic device via a network connection. Additionally, the electronic device may receive an additional audio data from the other electronic device and output audio represented by the additional audio data. In some instances, the audio data generated by the electronic device may represent more than speech from the user, such as echo (e.g., the audio being output by the electronic device) and/or noise. This may cause problems for the users trying to communicate using the electronic devices.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
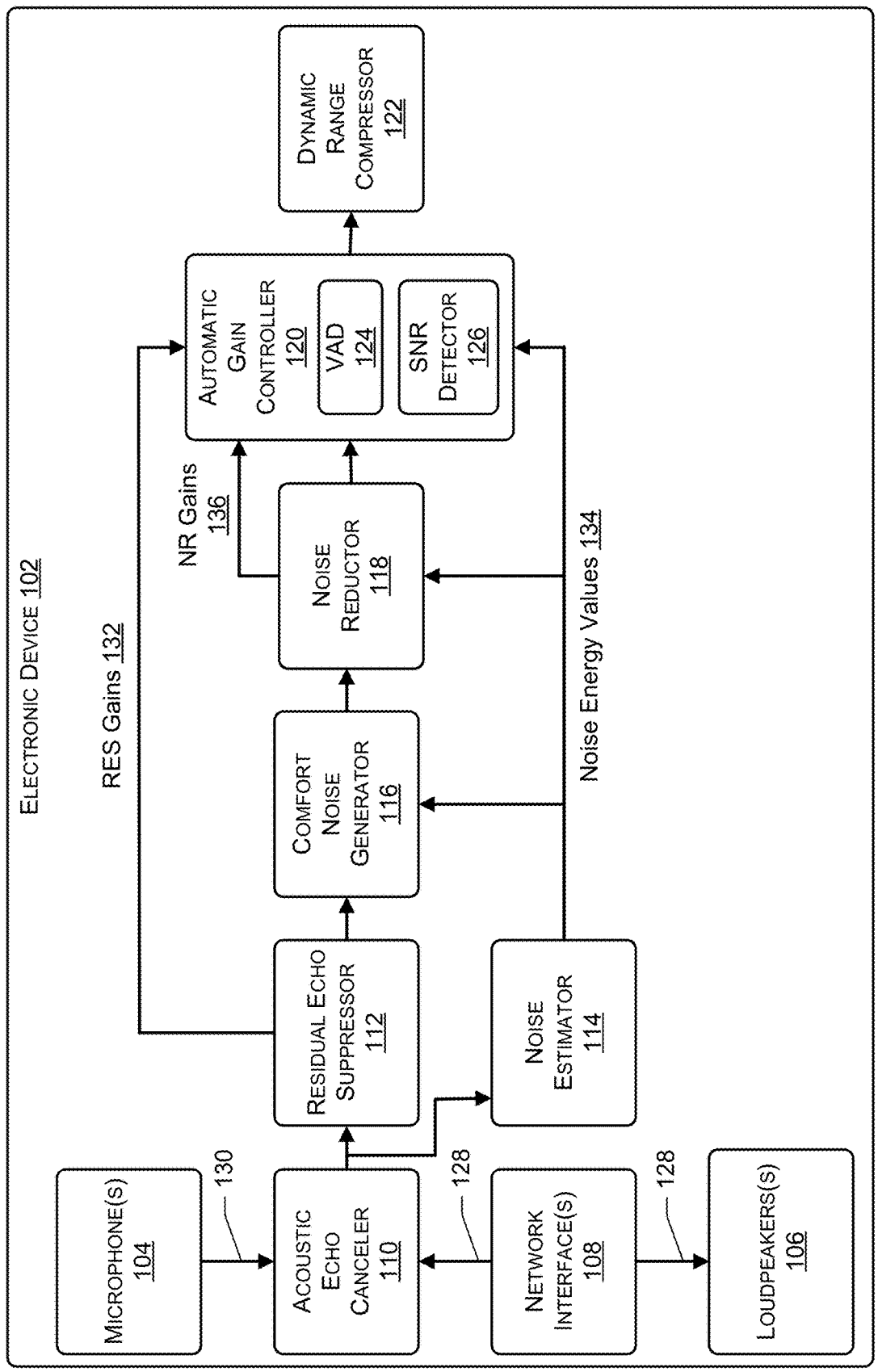
FIG. 1 illustrates a block diagram of an example electronic device that processes audio data using an audio processing pipeline.

This disclosure describes, in part, devices and techniques for processing audio data. For instance, an electronic device may be generating audio data representing user speech from a user. The electronic device may then send the audio data to another electronic device, such as a remote system. Additionally, the electronic device may receive additional audio data from the other electronic device and output audio represented by the received audio data. In some examples, the audio data being generated by the electronic device may represent more than just the user speech from the user, such as echo (e.g., the audio being output), noise, and/or the like that reduces the quality of the audio data. As such, to improve the quality of the audio data, the electronic device may initially process the audio data using a processing pipeline and then send the processed audio data to the other electronic device.

The processing pipeline may include an automatic gain controller (AGC) that uses one or more algorithms to normalize the audio data. For instance, the AGC may determine gains (which may be referred to as "AGC gains") to apply to the audio data. To determine the AGC gains, the AGC may determine input energy values of the audio data and a target energy value for outputting the audio data. The AGC may then determine an AGC gain as the difference between the input energy value and the target energy value. In some instances, the input energy values of the audio data may fluctuate, such as when the user is moving around in an environment that includes the electronic device. That is, as the distance between the user and electronic devices changes, the input energy value of the audio data generated by the electronic device may change. As such, the AGC may continue to determine the input energy values of the audio data and then use the determined input energy values when determining the AGC gains to apply to the audio data.

In some instances, the AGC may "smooth" the AGC gains that are applied to the audio data by using a time-constant parameter. For instance, the time-constant parameter may set how much averaging is performed on the AGC gains by a filter. In some instances, the filter may include a one-pole filter. In other instances, the filter may include any type of filter that smooths, attenuates, and/or amplifies audio data. In some instances, the time-constant parameter represents a value, such as an amount of time that is used when performing the averaging. For example, if the AGC is performing the averaging over 8 milliseconds, the time-constant parameter may include 8 milliseconds. While this is just one example value, in other examples, the time-constant parameter may include any other value.

In some instances, the AGC may include a voice activity detector (VAD) that analyzes the audio data to detect user speech represented by the audio data. During times at which the VAD detects user speech, the AGC may operate in a first mode (e.g., an attack mode) in which the AGC updates the AGC gains to be applied to the audio data. For instance, while operating in the first mode, the AGC may update the AGC gains by increasing or decreasing the AGC gains being applied to the audio data. Additionally, during times at which the VAD does not detect user speech, the AGC may operate in a second mode (e.g., a release mode). In some instances, while operating in the second mode, the AGC may decrease the AGC gains being applied to the audio data. In some instances, while operating in the second mode, the AGC may refrain from updating the AGC gains.

In some instances, the AGC may use information from a residual echo suppressor (RES), which is included in the processing pipeline, to determine the AGC gains being applied to the audio data. For instance, the RES may include one or more algorithms that suppress (e.g., remove) residual echo represented by the audio data. In some instances, the residual echo may include echo that was not cancelled by an acoustic echo canceler (AEC). To suppress the residual echo, the RES may detect the residual echo represented by the audio data. The RES may then determine gains (in time domain, across frequencies/subbands, or average values across frequencies/subbands) (which may be referred to as "RES gains") to apply to the audio data in order to suppress the echo. The AGC may then uses the RES gains from the RES to determine the AGC gains to apply to the audio data.

For instance, the AGC may use the RES gains to determine whether the audio data represented residual echo. For example, the RES gains may include a value that ranges from 0 to 1 on a linear scale. The AGC may interpret RES gains as confidence levels (which may be referred to as "RES confidence levels") indicating whether the audio data represented residual echo or whether the audio data represented a near-end signal. For instance, the AGC may interpret RES gains that are close to 0 (e.g., a RES confidence level that is close to 0%) as indicating a greater probability of residual echo. Additionally, the AGC may interpret RES gains that are close to 1 (e.g., a RES confidence level that is close to 100%) as indicating a lower probability of residual echo and/or the presence of a near-end signal. Furthermore, the AGC may interpret RES gains that are close to 0.5 (e.g., a RES confidence level that is close to 50%) as indicating a probability of residual echo that is between the greater probability (e.g., 100%) and the lower probability (e.g., 0%). Although a scale of 0 to 1 is used in the example above, in other examples, the RES gains may include values that fall within other ranges (e.g., 0 to 100, −1,000 to 1,000, etc.). In either of the examples, the AGC may use these RES confidence levels when processing the audio data.

In some instances, the AGC may use the RES confidence levels to determine the input energy values for the audio data. For instance, as discussed above, the AGC may determine the input energy values of the audio data. Since the input energy values may fluctuate, the AGC uses a time-constant parameter that sets how much averaging is performed on the input energy values. As such, the AGC may use the RES confidence levels to determine new time-constant parameter(s) that are used to set the averaging that is performed on the input energy values. For example, the AGC may multiply the time-constant parameter by a RES confidence level (and/or an RES gain) to determine a new time-constant parameter that sets the averaging that is performed on the input energy values. In such an example, when the RES is confident that the audio data does not represent residual echo (e.g., the RES gains are close to 1), then the new time-constant parameter is similar to the original time-constant parameter (e.g., a near to normal smoothing occurs). However, when the RES is confident that the audio data represents residual echo (e.g., the RES gains are close to 0), then the new time-constant parameter is less than the original time-constant parameter. This may cause the updates to the input energy values to slow down and/or completely stop.

In some instance, the AGC may use the RES confidence levels to determine the AGC gains updates for the audio data. For instance, and as discussed above, when determining the AGC gains, the AGC may use a time-constant parameter that sets how much averaging is performed for the AGC gains. As such, the AGC may use the RES confidence levels to determine new time-constant parameter(s) that are used to set the averaging. For a first example, when the AGC is operating in the first mode (e.g., the attack mode), the AGC may determine a new time-constant parameter that sets the averaging by multiplying the original time-constant parameter by the RES confidence level (and/or the RES gain). In such an example, when the RES is confident that the audio data does not represent residual echo and/or includes a near-end signal (e.g., the RES gains are close to 1), then the new time-constant parameter is similar to the original time-constant parameter (e.g., a near to normal smoothing occurs). However, when the RES is confident that the audio data represents residual echo (e.g., the RES gains are close to 0), then the new time-constant parameter is less than the original time-constant parameter. This may cause the updates to the AGC gains to slow down and/or completely stop.

For a second example, such as when the AGC is operating in the second mode (e.g., the release mode), the original time-constant parameter may be multiplied by the complement of the RES confidence level (e.g., 1-RES gains). In such an example, when the RES is confident that the audio data does not represent residual echo and/or includes a near-end signal (e.g., the RES gains are close to 1), then the new time-constant parameter is less than the original time-constant parameter. This may slow down the reduction to the AGC gains while the AGC is operating in the second mode. However, when the RES is confident that the audio data represents residual echo (e.g., the RES gains are close to 0), then the new time-constant parameter is similar to the original time-constant parameter. This may cause the updates to the AGC gains to include a near to normal smoothing.

Additionally, or alternatively, in some instances, the AGC may use a "hard thresholding" technique when using the RES gains to determine the AGC gains. For instance, and as discussed above, the AGC may operate in the first mode when the VAD detects the user speech. As such, when using the "hard thresholding" technique, before operating in the first mode, the AGC may first determine whether the RES confidence level satisfies (e.g., is equal to or greater than) a threshold. As described herein, a threshold may include, but is not limited to, 75%, 90%, 95%, and/or any other threshold level. Based on determining that the RES confidence level satisfies the threshold, the AGC may then operate in the first mode. However, based on determining that the RES confidence level does not satisfy (e.g., is less than) the threshold, the AGC may then operate in the second mode. In some instances, when using the "hard thresholding" technique, the AGC may use RES confidence level(s) for one or more subbands of the audio data.

For a first example, the AGC may determine to operate in the first mode when the VAD detects speech and each of the RES confidence level(s) for the subbands satisfies a respective threshold. The AGC may then determine to operate in the second mode when at least one of the RES confidence level(s) does not satisfy the respective threshold. For a second example, the AGC may determine to operate in the first mode when the VAD detects speech and at least one of the RES confidence level(s) for the subbands satisfies a respective threshold. The AGC may then determine to operate in the second mode when each of the confidence level(s) does not satisfy the respective threshold. Still, for a third example, the AGC may determine to operate in the first mode when the VAD detects speech and a RES confidence level for a specific subband satisfies a threshold. The AGC may then determine to operate in the second mode when the RES confidence level does not satisfy the threshold. In either of the examples above, the threshold(s) for the subbands may be the same as the threshold used for the audio data or the threshold(s) for the subbands may be different than the threshold used for the audio data.

In some instances, the AGC may use information from a noise estimator and/or noise reductor, which are included in the processing pipeline, to determine the AGC gains being applied to the audio data. For instance, the noise estimator may determine noise energy values associated with the noise represented by the audio data. Additionally, the noise reductor may determine gains (which may be referred to as "NR gains") to apply to the audio data in order to reduce the noise represented by the audio data. The AGC may then determine signal-to-noise ratios (SNRs) of the audio data using the input energy values, the noise energy values, and the NR gains. For example, the AGC may determine new noise energy values by subtracting the noise energy values determined by the noise estimator by the NR gains. The AGC may then determine the SNRs by taking ratios of the input energy values to the new noise energy values.

The AGC may then use the SNRs as confidence levels (referred to as "SNR confidence levels") for the audio data, similar to the RES confidence levels described above. For instance, the SNR confidence levels may represent a speech presence probability indicating a likelihood that the audio data represents the user speech or represents noise. In some instances, and similar to the RES confidence levels described above, the SNR confidence levels may include a value that ranges between 0 to 100 (although other ranges may be used). For example, the AGC may determine a SNR confidence level using a SNR. The AGC may determine that the SNR confidence level is close to 100 when the SNR is high (e.g., the input energy value is greater than the noise energy value). A high SNR may include, but is not limited to, 75 decibels, 100 decibels, and/or the like. Additionally, the AGC may determine that the SNR confidence level is close to 0 when the SNR is low (e.g. the input energy value is close to the noise energy value). A low SNR may include, but is not limited to, 1 decibel, 5 decibels, and/or the like. Furthermore, the AGC may determine that the SNR confidence level is between 0 and 100 when the SNR is between the high SRN and the low SNR.

The AGC may then use the SNR confidence levels to determine the AGC gains for the audio data, similar to the how the AGC used the RES confidence levels above. For a first example, the AGC may use the SNR confidence levels to determine the time-constant parameters that are used to set the averaging of the input energy values for the audio data. For a second example, the AGC may use the SNR confidence levels to determine the time-constant parameters that are used to set how much averaging is performed for the AGC gains. Still, for a third example, the AGC may use the SNR confidence levels for the "hard thresholding" technique to determine when the AGC is to operate in the first mode and when the AGC is to operate in the second mode.

In some instances, the AGC may use both the RES gains and the SNRs to determine the AGC gains to be applied to the audio data. For a first example, the AGC may determine a new time-constant parameter associated with determining the input energy values using the RES confidence levels associated with the RES gains and the SNR confidence levels associated with the SNRs. In some instances, the AGC may determine a new time-constant parameter by multiplying a time-constant parameter by a RES confidence level associated with a RES gain and a SNR confidence level associated with a SNR. In some instances, the AGC may determine a new time-constant parameter by multiplying a time-constant parameter by a greater confidence level between a RES confidence level associated with a RES gain and a SNR confidence level associated with a SNR. Still, in some instances, the AGC may determine a new time-constant parameter by multiplying a time-constant parameter by a lesser confidence level between a RES confidence level associated with a RES gain and a SNR confidence level associated with a SNR.

For a second example, the AGC may determine a new time-constant parameter associated with determining the AGC gains using the RES gains and the SNRs. In some instances, the AGC may determine a new time-constant parameter by multiplying a time-constant by a parameter by a RES confidence level associated with a RES gain and a confidence level associated with a SNR. In some instances, the AGC may determine a new time-constant parameter by multiplying a time-constant parameter by a greater confidence level between a RES confidence level associated with a RES gain and a SNR confidence level associated with a SNR. Still, in some instances, the AGC may determine a new time-constant parameter by multiplying a time-constant parameter by a lesser confidence level between a RES confidence level associated with a RES gain and a SNR confidence level associated with a SNR.

For a third example, the AGC may use a "hard thresholding" technique when using the RES gains and the SNRs to determine the AGC gains. For instance, the AGC may determine whether a RES confidence level associated with an RES gain satisfies a first threshold and determine whether a SNR confidence level associated with a SNR satisfies a second threshold. In some instances, the first threshold is the same as the second threshold. In other instances, the first threshold is different than (e.g., greater than or less than) the second threshold.

In some instances, the AGC may then operate in the first mode when the VAD detects the user speech, the RES confidence level associated with the RES gain satisfies the first threshold, and the SNR confidence level associated with the SNR satisfies the second threshold. In some instances, the AGC may then operate in the first mode when the VAD detects the user speech and at least one of the RES confidence level associated with the RES gain satisfies the first threshold or the SNR confidence level associated with the SNR satisfies the second threshold. Still, in some instances, the AGC may operate in the first mode when at least one of the VAD detects the user speech, the RES confidence level associated with the RES gain satisfies the first threshold, or the SNR confidence level associated with the SNR satisfies the second threshold In some instances, by using the RES gains and the SNRs to determine the AGC gains, the AGC may determine AGC gains that better resemble the audio represented by the audio data. For a first example, if the VAD wrongfully detects that the audio data represents user speech, the AGC may still apply less ACC gains to the audio data based on the RES gains and the SNRs. As such, the AGC may not apply high AGC gains to portions of the audio data which the RES and/or the noise reductor suppressed. For a second example, and when using the "hard thresholding" techniques, if the VAD wrongfully detects that the audio data represents user speech, the AGC may still operate in the second mode based on the RES gains and the SNRs. Still, for a third example, when the VAD does not detect user speech, but the audio data does represent user speech, the AGC may perform updates to the AGC gains at a slower rate based on the AGC gains and the SNRs.

FIG. 1 illustrates a block diagram of an electronic device 102 that processes audio data using an audio processing pipeline. As shown, the electronic device 102 may include microphone(s) 104, loudspeaker(s) 106, and network interface(s) 108. The electronic device 102 may further include the audio processing pipeline, which includes an acoustic echo canceler (AEC) 110, a residual echo suppressor (RES) 112, a noise estimator 114, a comfort noise generator (CNG) 116, a noise reductor 118, an automatic gain controller (AGC) 120, and a dynamic range compressor (DRC) 122. The AGC 120 includes a voice activity detector (VAD) 124 and a signal-to-noise ratio (SNR) detector 126. In some instances, the audio processing pipeline may not include one or more of the components illustrated in FIG. 1. In some instances, the audio processing pipeline may include one or more additional components not illustrated in FIG. 1. Still, in some examples, the VAD 124 and/or the SNR detector 126 may be separate from the AGC 120.

In the example of FIG. 1, the network interface(s) 108 may receive audio data 128 (e.g., far-end audio data) from one or more other electronic devices, such as a remote system. The electronic device 102 may then output audio represented by the audio data 128 using the loudspeaker(s) 106. Additionally, the AEC 110 may use the audio data 128 for processing audio data 130 (e.g., near-end audio data) generated by the microphone(s) 104.

For example, the electronic device 102 may use the microphone(s) 104 to generate the audio data 130. The audio data 130 may represent user speech from a user. Additionally, the audio data 130 may represent echo corresponding to the audio being output by the loudspeaker(s) 106. The electronic device 102 may use the audio processing pipeline to process the audio data 130 before being output. In some instances, the electronic device 102 outputs the audio data 130 by sending, using the network interface(s) 108, the audio data 130 to one or more computing devices. In some instances, in addition to, or alternatively from outputting the audio data 130, the electronic device 102 may analyze the audio data 130, such as by using or more speech-processing techniques (e.g., automatic speech recognition, natural language understanding, wakeword detection, etc.).

To process an audio data 130, the AEC 110 may include one or more algorithms that remove at least a portion of the echo represented by the audio data 130. For instance, the AEC 110 may use the audio data 128 representing the audio being output by the loudspeaker(s) 106 to identify at least a portion of the audio data 130 that represents the at least the portion of the echo. The AEC 110 may then filter and/or delay the audio data 128 such that the audio data 128 resembles the audio data 130. The AEC 110 may then remove (e.g., subtract) the filtered audio data 128 from the audio data 130. This may remove the at least the portion of the echo represented by the audio data 130.

Next, the RES 112 may include one or more algorithms that suppress any residual echo that is still represented by the audio data 130. For instance, the RES 112 may determine a RES gain 132 (in time domain, across frequencies/subbands, or average values across frequencies/subbands) and then use the RES gain 132 to suppress the residual echo represented by the audio data 130. In some instances, the RES 112 may determine the RES gain 132 based at least in part on an estimate of the residual echo and an energy value of the audio data 130 as output from the AEC 110. In some instances, the RES 112 may determine a respective RES gain 132 for one or more subbands of the audio data 130. In such instances, the RES 112 may suppress the residual echo from the subbands using the respective RES gains 132. Additionally, the RES 112 may determine a total RES gain 132 applied to the audio data 130. The total RES gain 132 may include, but is not limited to, the average, the median, the mode, and/or the like of the respective RES gains 132 determined for the subbands of the audio data 130.

The noise estimator 114 may include one or more algorithms to determine noise energy values 134 for the audio data 130. In some instances, the noise energy values 134 may indicate measurements of the amount of noise represented by the audio data 130. For instances, the noise energy values 134 may indicate how many decibels of noise are represented by the audio data 130.

The noise reductor 118 may include one or more algorithms that remove at least a portion of the noise from the audio data 130. For instance, the noise reductor 118 may determine NR gains 136 and then use the NR gains 136 to remove the at least the portion of the noise from the audio data 130. In some instances, the noise reductor 118 uses the noise energy values 134 to determine the NR gains 136. In some instances, the noise reductor 118 may include a noise estimator (and/or the noise estimator 114) that determines the noise energy values 134. The noise reductor 118 then use the determined noise energy values 134 to determine the NR gains 136.

In some instances, the NR gains 136 may be associated with the input energy values of the audio data 130 and the output energy values of the audio data 130. For instances, and using power levels, the NR gains 136 may be calculated using the following equation:

$$\text{Gain} = 10\log\left(\frac{P_{out}}{P_{in}}\right) \quad (1)$$

In equation (1), the $P_{out}$ may include the power applied to the input of the noise reductor 118 and the $P_{in}$ may include the power from the output of the noise reductor 118. While this is just one example equation for determining the NR gains 136, in other examples, other equations may be utilized to determine the NR gains 136.

The AGC 120 may include one or more algorithms to normalize the audio data 130. For instance, the AGC 120 may determine AGC gains to apply to the audio data 130 in order to normalize the output energy value of the audio data 130. To determine the AGC gains, the AGC 120 may determine input energy values of the audio data 130 and a target energy value for outputting the audio data 130. The AGC 120 may then determine an AGC gain as the difference between the input energy value and the target energy value. In some instances, the input energy values of the audio data 130 may fluctuate, such as when the user is moving around in an environment that includes the electronic device 102. As such, the AGC 120 may continue to determine the inputs levels of the audio data 130 and then use the determined input energy values when determining the AGC gains to apply to the audio data 130. The AGC may then "smooth" the AGC gains that are applied to the audio data 130 by using a time-constant parameter to average the AGC gains.

In some instances, the AGC 120 may smooth the AGC gains that are applied to the audio data by using a time-constant parameter. For instance, the time-constant parameter may set how much averaging is performed on the AGC gains by a filter. In some instances, the filter may include a one-pole filter. In other instances, the filter may include any type of filter that smooths audio data.

In some instances, the VAD 124 of the AGC 120 includes one or more algorithms that analyzes the audio data 130 to detect user speech represented by the audio data 130. During times at which the VAD 124 detects user speech, the AGC 120 may operate in a first mode (e.g., an attack mode) in which the AGC 120 updates the AGC gains to be applied to the audio data 130. For instance, the AGC 120 may update the AGC gains by increasing or decreasing the AGC gains being applied to the audio data 130 while the AGC 120 is operating in the first mode. Additionally, during times at which the VAD 124 does not detect user speech, the AGC 120 may operate in a second mode (e.g., a release mode). In some instances, while, in the second mode, the AGC 120 may decrease the AGC gains being applied to the audio data 130. In some instances, while in the second mode, the AGC 120 may refrain from updating the AGC gains being applied to the audio data 130.

The AGC 120 may use the RES gains 132, the noise energy values 134, and/or the NR gains 136 to determine AGC gains to be applied to the audio data 130. For instance, the AGC 120 may use the RES gains 132 to determine whether the audio data 130 represented residual echo. For example, the RES gains 132 may a value that ranges between 0 to 1 on a linear scale. The AGC 120 may interpret RES gains 132 as RES confidence levels indicating whether the audio data 130 represented residual echo and/or whether the audio data 130 represented a near-end signal. For instance, the AGC 120 may interpret RES gains 132 that are close to 0 (e.g., a RES confidence level that is close to 0%) as indicating a greater probability of residual echo. Additionally, the AGC 120 may interpret RES gains 132 that are close to 1 (e.g., a RES confidence level that is close to 100%) as indicating a lower probability of residual echo and/or a greater probability of the presence of a near-end signal. Furthermore, the AGC 120 may interpret RES gains 132 that are close to 0.5 (e.g., a RES confidence level that is close to 50%) as indicating a probability of residual echo that is between the greater probability (e.g., 100%) and the lower probability (e.g., 0%)

When using the scale of 0 to 1, the AGC 120 may determine the RES confidence levels by multiplying the RES gains by 100. For instance, and in the example above, the AGC 120 may determine that an RES gain 132 of 0.5 includes a RES confidence level of 50%. Additionally, the AGC 120 may determine that an RES gain of 0.75 includes an RES confidence level of 75%. Still, the AGC 120 may determine that an RES gain of 1 includes an RES confidence level of 100%. While these are just a few examples of using the RES gains 132 to determine RES confidence levels, in other examples, the AGC 120 may use other method, techniques, and/or equestions to determine RES confidence levels using the RES gains 132.

In some instances, the AGC 120 may use the RES confidence levels to determine the input energy values for the audio data 130. For instance, as discussed above, the AGC 120 may determine the input energy values of the audio data 130. Since the input energy values may fluctuate, the AGC 120 uses a time-constant parameter that sets how much averaging is performed on the input energy values. As such, the AGC 120 may use the RES confidence levels to determine new time-constant parameter(s) that are used to set the averaging for the input energy values. For example, the AGC 120 may multiply the time-constant parameter by a RES confidence level (e.g., by an RES gain 132) to determine a new time-constant parameter that sets the averaging that is performed on the input energy values. For example, the AGC 120 may use the following equation:

$$NTCP=TCP \times CL \quad (2)$$

In equation (2), NTCP includes the new time-constant parameter, TCP includes the original time-constant parameter, and CL includes the RES confidence level (and/or the RES gain 132). In such an example, when the RES 112 is confident that the audio data 132 does not represent residual echo (e.g., the RES gains 132 are close to 1 and/Or the RES confidence level is close to 100%), then the new time-constant parameter is similar to the original time-constant parameter (e.g., a near to normal smoothing occurs). However, when the RES 112 is confident that the audio data 130 represents residual echo (e.g., the RES gains 132 are close to 0 and/or the RES confidence level is close to 0%), then the new time-constant parameter is less than the original time-constant. This may cause the updates to the input energy values to slow down and/or completely stop.

Although this is just one example equation for using the RES confidence levels (and/or the RES gains 132) to determine the new time-constant parameters, in other examples, the AGC 120 may utilize one or more other methods, techniques, and/or equations to determine the new time-constant parameters using the RES confidence levels (and/or the RES gains 132).

In some instance, the AGC 120 may use the RES confidence levels to determine the AGC gain updates for the audio data 130. For instance, when determining the AGC gains, the AGC 120 may use a time-constant parameter that sets how much averaging is performed for the AGC gains. As such, the AGC 120 may use the RES confidence levels (e.g., the RES gains 132) to determine new time-constant parameter(s) that are used to set the averaging. For a first example, when the AGC 120 is operating in the first mode (e.g., the attack mode), the AGC 120 may determine a new time-constant parameter that sets the averaging by multiplying the original time-constant parameter by the RES confidence level (e.g., by the RES gain 132), which may be similar to equation (2). In such an example, when the RES 112 is confident that the audio data 130 does not represent residual echo and/or includes a near-end signal (e.g., the RES gains 132 are close to 1 and/or the RES confidence level is close to 100%), then the new time-constant parameter is similar to the original time-constant parameter (e.g., a near to normal smoothing occurs). However, when the RES 112 is confident that the audio data 130 represents residual echo (e.g., the RES gains 132 are close to 0 and/or the RES confidence level is close to 0%), then the new time-constant parameter is less than the original time-constant parameter. This may cause the updates to the AGC gains to slow down and/or completely stop.

For a second example, such as when the AGC 120 is operating in the second mode (e.g., the release mode), the original time-constant parameter may be multiplied by the complement of the RES confidence level. For instance, the AGC 120 may use the following equation:

$$NTCP=TCP \times (100\%-CL) \quad (3)$$

In such an example, when the RES 112 is confident that the audio data 130 does not represent residual echo and/or includes a near-end signal (e.g., the RES gains 132 are close to 1 and/or the RES confidence level is close to 100%), then the new time-constant parameter is less than the original time-constant parameter. This may slow down the reduction to the AGC gains while the AGC 120 is operating in the second mode. However, when the RES 112 is confident that the audio data 130 represents residual echo (e.g., the RES gains 132 are close to 0 and/or the RES confidence level is close to 0%), then the new time-constant parameter is similar to the original time-constant parameter. This may cause the updates to the AGC gains to include a near to normal smoothing.

Although this is just one example equation for using the RES confidence levels (and/or the RES gains 132) to determine the new time-constant parameters, in other examples, the AGC 120 may utilize one or more other methods, techniques, and/or equations to determine the new time-constant parameters using the RES confidence levels (and/or the RES gains 132). Additionally, in some instances, the original time-constant parameter used to determine the input energy values may be the same as the time-constant parameter used to determine the AGC gains. In other instances, the original time-constant parameter used to determine the input energy values may be different than the time-constant parameter used to determine the AGC gains.

Additionally, or alternatively, in some instances, the AGC 120 may use a "hard thresholding" technique when using the RES gains 132 to determine the AGC gains. For instance, and as discussed above, the AGC 120 may operate in the first mode when the VAD 124 detects the user speech. As such, when using the "hard thresholding" technique, before operating in the first mode, the AGC 120 may first determine whether the RES confidence level satisfies (e.g., is equal to or greater than) a threshold. The threshold may include, but is not limited to, 75%, 90%, 95%, and/or any other threshold number. Based on determining that the RES confidence level satisfies the threshold, the AGC 120 may then operate in the first mode. However, based on determining that the RES confidence level does not satisfy (e.g., is less than) the threshold, the AGC 120 may then operate in the second mode. In some instances, when using the "hard thresholding" technique, the AGC 120 may use RES confidence level(s) for one or more subbands of the audio data 130.

For a first example, the AGC 120 may determine to operate in the first mode when the VAD 124 detects speech and each of the RES confidence level(s) for the subbands satisfies the threshold. The AGC 120 may then determine to operate in the second mode when at least one of the RES confidence level(s) does not satisfy the threshold. For a second example, the AGC 120 may determine to operate in the first mode when the VAD 124 detects speech and at least one of the RES confidence level(s) for the subbands satisfies the threshold. The AGC 120 may then determine to operate in the second mode when each of the confidence level(s) does not satisfy the threshold. Still, for a third example, the AGC 120 may determine to operate in the first mode when the VAD 124 detects speech and a RES confidence level for a specific subband satisfies the threshold. The AGC 120 may then determine to operate in the second mode when the RES confidence level does not satisfy the threshold. In either of the examples above, the threshold(s) for the subbands may be the same as the threshold used for the audio data 130 or the threshold(s) for the subbands may be different than the threshold used for the audio data 130.

In some instances, in addition to, or alternatively from, using comparing the RES confidence levels when performing the "hard thresholding" technique, the AGC 120 may compare the RES gains 132 to threshold(s). In such instances, a threshold may include, but is not limited to, 0.75, 0.9, 0.95, and/or any other threshold. Additionally, in such instances, the AGC 120 may determine whether to operate in the first mode or the second mode based on whether the RES gains satisfy the threshold(s), similar to the RES confidence levels above.

In some instances, the AGC 120 may use the noise energy values 134 and the NR gains 136 to determine the AGC gains. For instance, the SNR detector 126 included in the AGC 120 may include one or more algorithms that determine SNRs of the audio data 130 using the input energy values, the noise energy values 134, and the NR gains 136. For example, the SNR detector 126 may determine new noise energy values by subtracting the NR gains 136 from the noise energy values 134 determined by the noise estimator 114. The SNR detector 126 may then determine the SNRs by taking ratios of the input energy values to the new noise energy values. For example, an example algorithm used by the SNR detector 126 may include:

$$SNR = \frac{P_{Signal}}{P_{Noise}} \tag{4}$$

In equation (4), $P_{Signal}$ includes the average power of the audio data 130 and $P_{Noise}$ includes the average power of the noise.

The AGC 120 may then use the SNRs to determine SNR confidence levels for the audio data 130. In some instances, and similar to the RES confidence levels described above, the SNR confidence levels may include a value that ranges between 0 to 100 (although other ranges may be used). In such an example, a SNR confidence level that is close to 100 may indicate the presence of the user speech represented by the audio data 130. Additionally, a SNR confidence level that is close to 0 may indicate the presence of noise in the audio data 130. The AGC 120 may use one or more techniques for determining the SRN confidence levels for the audio data 130.

For example, the AGC 120 may determine a SNR confidence level using a SNR. The AGC 120 may determine that the SNR confidence level is close to 100 when the SNR is high (e.g., the input energy value is greater than the noise energy value). A high SNR may include, but is not limited to, 75 decibels, 100 decibels, and/or the like. Additionally, the AGC 120 may determine that the SNR confidence level is close to 0 when the SNR is low (e.g. the input energy value is close to the noise energy value). A low SNR may include, but is not limited to, 1 decibel, 5 decibels, and/or the like. Furthermore, the AGC 120 may determine that the SNR confidence level is between 0 and 100 when the SNR is between the high SRN and the low SNR.

The AGC 120 may then use the SNR confidence levels to determine the AGC gains for the audio data 130, similar to the how the AGC 120 used the RES confidence levels described above. For a first example, the AGC 120 may use the SNR confidence levels to determine the time-constant parameters that are used to set the averaging of the input energy values for the audio data 130. For a second example, the AGC 120 may use the SNR confidence levels to determine the time-constant parameters that are used to set how much averaging is performed for the AGC gains. Still, for a third example, the AGC 120 may use the SNR confidence levels for the "hard thresholding" technique to determine when the AGC 120 is to operate in the first mode and when the AGC 120 is to operate in the second mode.

In some instances, the AGC 120 may use both the RES gains 132 and the SNRs to determine the AGC gains to be applied to the audio data 130. For a first example, the AGC 120 may determine a new time-constant parameter associated with determining the input energy values using the RES confidence levels associated with the RES gains 132 and the SNR confidence levels associated with the SNRs. In some instances, the AGC 120 may determine a new time-constant parameter by multiplying a time-constant parameter by a RES confidence level associated with a RES gain 132 and a SNR confidence level associated with a SNR. In some instances, the AGC 120 may determine a new time-constant parameter by multiplying a time-constant parameter by a greater confidence level between a RES confidence level associated with a RES gain 132 and a SNR confidence level associated with a SNR. Still, in some instances, the AGC 120 may determine a new time-constant parameter by multiplying a time-constant parameter by a lesser confidence level between a RES confidence level associated with a RES gain 132 and a SNR confidence level associated with a SNR.

For a second example, the AGC 120 may determine a new time-constant parameter associated with determining the AGC gains using the RES gains 132 and the SNRs. In some instances, the AGC 120 may determine a new time-constant parameter by multiplying a time-constant by parameter by a RES confidence level associated with a RES gain 132 and a confidence level associated with a SNR. In some instances, the AGC 120 may determine a new time-constant parameter by multiplying a time-constant parameter by a greater confidence level between a RES confidence level associated with a RES gain 132 and a SNR confidence level associated with a SNR. Still, in some instances, the AGC 120 may determine a new time-constant parameter by multiplying a time-constant parameter by a lesser confidence level between a RES confidence level associated with a RES gain 132 and a SNR confidence level associated with a SNR.

For a third example, the AGC 120 may use a "hard thresholding" technique when using the RES gains 132 and the SNRs to determine the AGC gains. For instance, the AGC 120 may determine whether a RES confidence level associated with an RES gain satisfies a first threshold and determine whether a SNR confidence level associated with a SNR satisfies a second threshold. In some instances, the first threshold is the same as the second threshold. In other instances, the first threshold is different than (e.g., greater than or less than) the second threshold.

In some instances, the AGC 120 may then operate in the first mode when the VAD 124 detects the user speech, the RES confidence level associated with the RES gain 132 satisfies the first threshold, and the SNR confidence level associated with the SNR satisfies the second threshold. In some instances, the AGC 120 may then operate in the first mode when the VAD 124 detects the user speech and at least one of the RES confidence level associated with the RES gain 132 satisfies the first threshold or the SNR confidence level associated with the SNR satisfies the second threshold. Still, in some instances, the AGC 120 may then operate in the first mode when at least one of the VAD 124 detects the user speech, the RES confidence level associated with the RES gain 132 satisfies the first threshold, or the SNR confidence level associated with the SNR satisfies the second threshold.

While the example of FIG. 1 includes arrows indicating an order for the processing of the audio data 130, in other examples, the audio processing pipeline may process the audio data 130 using a different order for the components. For example, the noise estimator 114 may be located between the noise reducer 118 and the AGC 120. In such an examples, the noise estimator 114 may determine the noise energy values 134 of the audio data 130 after the audio data 130 has been processed by at least the AEC 110, the RES 112, and/or the noise reducer 118.

Figure 2:
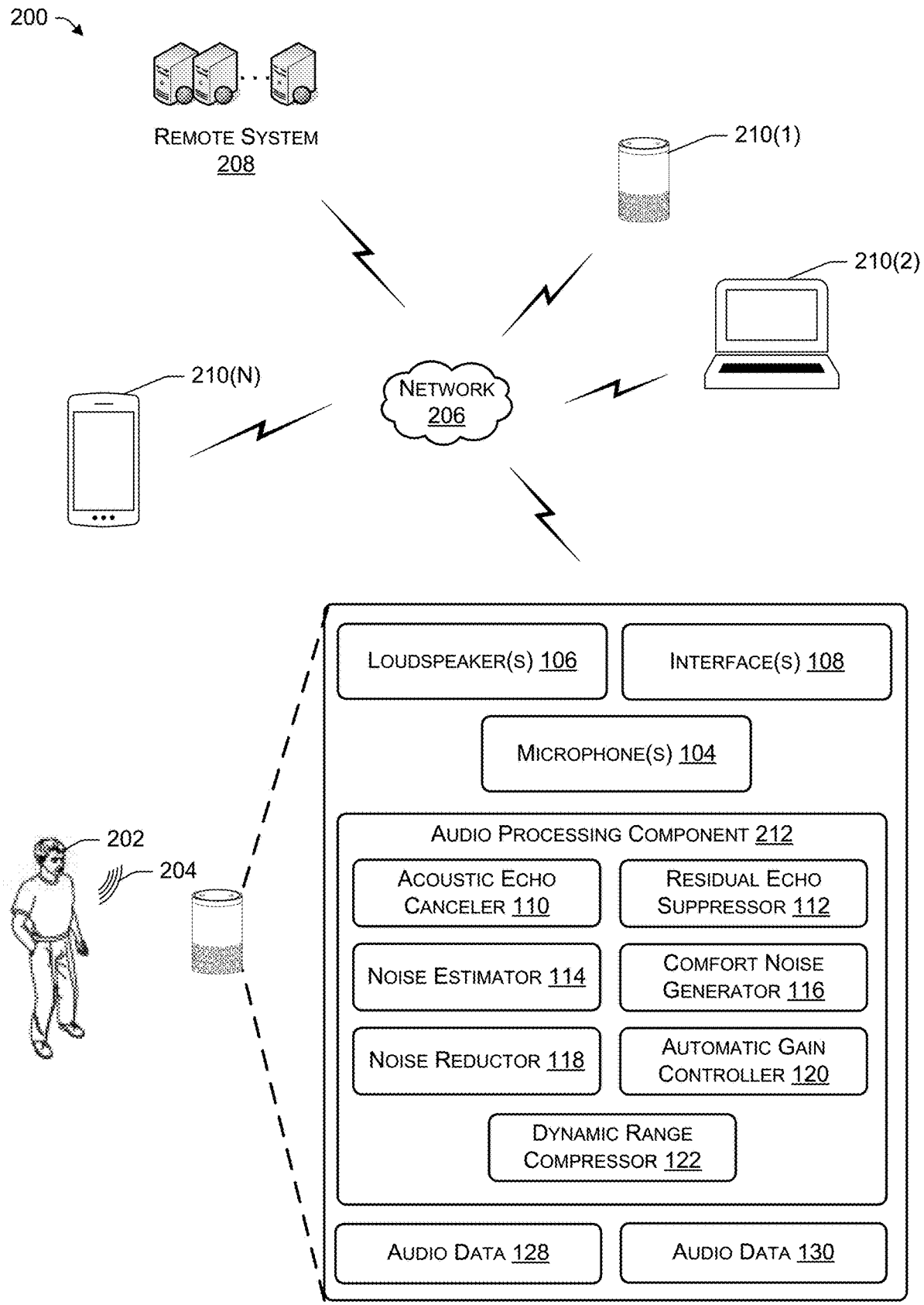
FIG. 2 illustrates a schematic diagram of an example environment that includes an electronic device communicating with one or more other electronic devices.

FIG. 2 illustrates a schematic diagram of an example environment 200 that includes the electronic device 102 communicating with one or more other electronic devices. As shown, a user 202 may communicating with the electronic device 102 using user speech 204. The electronic device 102 may use the microphone(s) 104 to generate the audio data 130 that represent at least the user speech 204. The electronic device 102 may then send, using the network interface(s) 108 and over a network 206, the audio data 130 to a remote system 208 and/or one or more other electronic devices 210(1)-(N) (which may be via the remote system 208).

Additionally, the electronic device 102 may receive, using the network interface(s) 108 and over the network 206, the audio data 128 from the remote system 208 and/or the one or more other electronic devices 210(1)-(N) (which may be via the remote system 208). In some instances, the audio data 128 may represent user speech from one or more other users. The electronic device 102 may then output, using the loudspeaker(s) 106, audio represented by the audio data 128.

Figure 3:
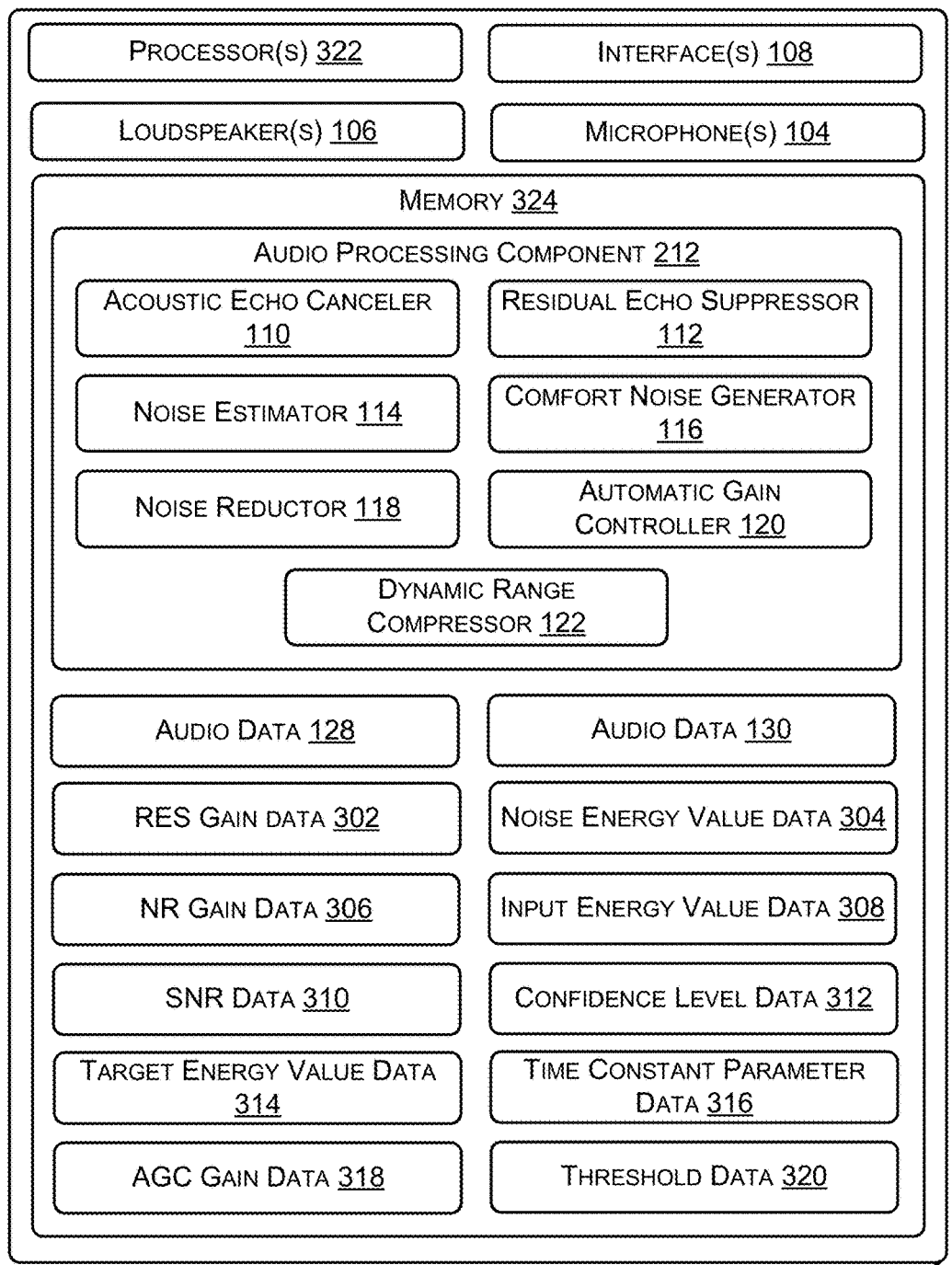
FIG. 3 illustrates a block diagram of another example electronic device that processes audio data using an audio processing pipeline.

FIG. 3 illustrates a block diagram of another example of the electronic device 102 that processes audio data using an audio processing pipeline. As shown, the electronic device 102 may store RES gain data 302, noise energy value data 304, NR gain data 306, input energy value data 308, SNR data 310, confidence level data 312, target energy value data 314, time-constant parameter data 316, AGC gain data 318, and threshold data 320.

The RES gain data 302 may represent the RES gains (e.g., the RES gains 132) determined by the RES 112. The noise energy value data 304 may represent the noise energy values determined by the noise estimator 114. The NR gain data 306 may represent the NR gains (e.g., the NR gains 136 determined by the noise reducer 118. Additionally, the input energy value data 308 may represent the input energy values determined by the AGC 120. Furthermore, the SNR data 310 may represent the SNRs determined by the SNR detector 126.

The confidence data 312 may represent the confidence levels associated with the RES gains 132 and/or the confidence levels associated with the NR gains 136. The target energy value data 314 may represent the target energy value determined by the AGC 120. The time-constant parameter data 316 may represent the time-constant parameters associated with determining the input energy values and/or the time-constant parameters associated with determining the ACG gains. Additionally, the AGC gain data 318 may represent the AGC gains determined by the AGC 120. Furthermore, the threshold data 322 may represent the threshold(s) 320 that are used by the AGC 120 for performing the "hard thresholding" techniques.

Although not illustrated in the example of FIG. 3, in some examples, the electronic device 102 may include a speech-processing component. The speech-processing component may include at least an automatic speech recognition (ASR) component, a natural language understanding (NLU) component, and a wakeword detection component. In some instances, after processing the audio data 130, the ASR component may analyze the audio data 130 in order to generate text data representing the user speech 204. The NLU component may then use the text data to make a semantic interpretation of the text. That is, the NLU component determines the meaning behind the text based on the individual words and then implements that meaning. The NLU component interprets a text string to derive an intent or a desired action from the user 202 as well as the pertinent pieces of information.

As further illustrated in FIG. 3, the electronic device 102 includes processor(s) 322 and memory 324. Although not illustrated in FIG. 3, in some examples, the electronic device 102 may include one or more additional components. For example, the electronic device 102 may include a display, input device(s), light(s), and/or the like.

Figure 4:
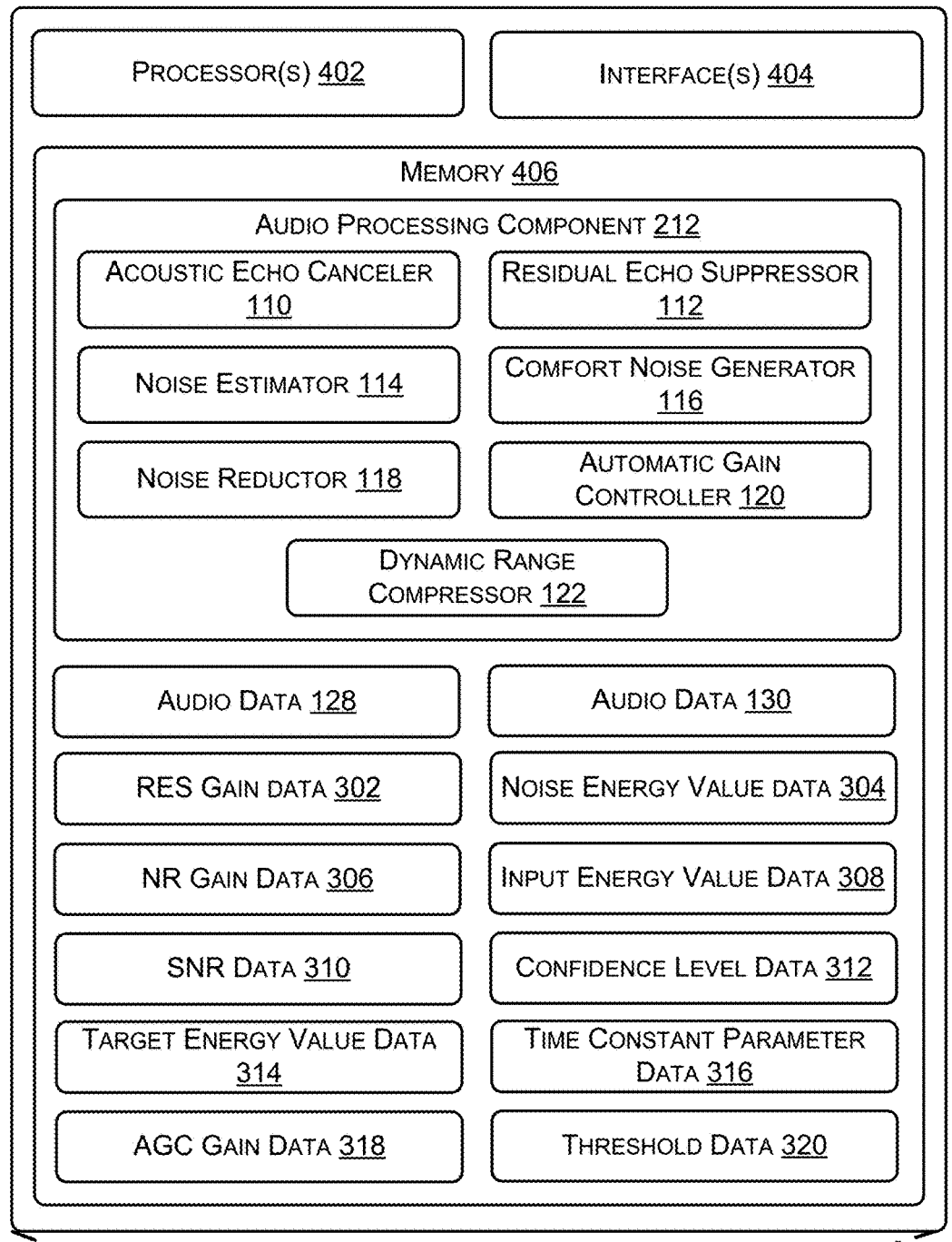
FIG. 4 illustrates a block diagram of a remote system that processes audio data using an audio processing pipeline.

FIG. 4 illustrates a block diagram of the remote system 208 that processes audio data using an audio processing pipeline. As shown, the remote system 208 may include the audio processing component 212 that is configured to process the audio data 130 generated by the electronic device 102 and/or the audio data 128 generated by the one or more other electronic devices) 210(1)-(N). For example, the remote system 208 may receive an audio data 130 from the electronic device 102. In some instances, the electronic device 102 may have already processed the audio data 130 using the audio processing component 212. In other instances, the electronic device 102 may not have processed the audio data 130. In either instance, the remote system 208 may process the audio data 130 using the audio processing component 212, similar to the electronic device 102 described above. The remote system 208 may then send the processed audio data 130 to the one or more other electronic devices 210(1)-(N).

Additionally, the remote system 208 may receive the audio data 128 from the one or more other electronic devices 210(1)-(N). In some instances, the one or more other electronic devices 210(1)-(N) may have already processed the audio data 128 using the audio processing component 212. In other instances, the one or more other electronic devices 210(1)-(N) may not have processed the audio data 128. In either instance, the remote system 208 may process the audio data 128 using the audio processing component 212, similar to the electronic device 102 described above. The remote system 208 may then send the processed audio data 128 to the electronic device 102.

As further illustrated in FIG. 4, the remote system 208 includes processor(s) 402, network interface(s) 404, and memory 406. As used herein, a processor, such as the processor(s) 322 and/or processor(s) 402 may include multiple processors and/or a processor having multiple cores. Further, the processors may comprise one or more cores of different types. For example, the processors may include application processor units, graphic processing units, and so forth. In one instance, the processor may comprise a microcontroller and/or a microprocessor. The processor(s) 322 and/or processor(s) 402 may include a graphics processing unit (GPU), a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 322, processor(s) 402, and/or processor(s) 308 may possess its own local memory, which also may store program components, program data, and/or one or more operating systems.

The memory 324 and/or the memory 406 may include volatile and nonvolatile memory, removable and non-removable media implemented in any method or technology for storage of information, such as computer-readable instructions, data structures, program component, or other data. The memory 324 and/or the memory 406 includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The memory 324 and/or the memory 406 may be implemented as computer-readable storage media ("CRSM"), which may be any available physical media accessible by the processor(s) 322 and/or the processor(s) 402 to execute instructions stored on the memory 324 and/or the memory 406. In one basic instance, CRSM may include random access memory ("RAM") and Flash memory. In other instances, CRSM may include, but is not limited to, read-only memory ("ROM"), electrically erasable programmable read-only memory ("EEPROM"), or any other tangible medium which can be used to store the desired information and which can be accessed by the processor(s).

Further, functional components may be stored in the respective memories, or the same functionality may alternatively be implemented in hardware, firmware, application specific integrated circuits, field programmable gate arrays, or as a system on a chip (SoC). In addition, while not illustrated, each respective memory, such as the memory 324 and/or the memory 406, discussed herein may include at least one operating system (OS) component that is configured to manage hardware resource devices such as the network interface(s), the I/O devices of the respective apparatuses, and so forth, and provide various services to applications or components executing on the processors. Such OS component may implement a variant of the FreeBSD operating system as promulgated by the FreeBSD Project; other UNIX or UNIX-like variants; a variation of the Linux operating system as promulgated by Linus Torvalds; the FireOS operating system from Amazon.com Inc. of Seattle, Wash., USA; the Windows operating system from Microsoft Corporation of Redmond, Wash., USA; LynxOS as promulgated by Lynx Software Technologies, Inc. of San Jose, Calif.; Operating System Embedded (Enea OSE) as promulgated by ENEA AB of Sweden; and so forth.

The network interface(s) 108 and/or the network interface(s) 404 may enable messages between the electronic device 102, the remote system 208, the one or more other electronic devices 210(1)-(N), and/or with one or more other remote systems, as well as other networked devices. The network interface(s) 108 and/or the network interface(s) 404 may include one or more network interface controllers (NICs) or other types of transceiver devices to send and receive messages over the network 108.

For instance, each of the network interface(s) 108 and/or the network interface(s) 404 may include a personal area network (PAN) component to enable messages over one or more short-range wireless message channels. For instance, the PAN component may enable messages compliant with at least one of the following standards IEEE 802.15.4 (ZigBee), IEEE 802.15.1 (Bluetooth), IEEE 802.11 (WiFi), or any other PAN message protocol. Furthermore, each of the network interface(s) 108 and/or the network interface(s) 404 may include a wide area network (WAN) component to enable message over a wide area network.

The operations and/or functionalities associated with and/or described with respect to the components of the remote system 208 may be performed utilizing cloud-based computing resources. For example, web-based systems such as Elastic Compute Cloud systems or similar systems may be utilized to generate and/or present a virtual computing environment for performance of some or all of the functionality described herein. Additionally, or alternatively, one or more systems that may be configured to perform operations without provisioning and/or managing servers, such as a Lambda system or similar system, may be utilized.

FIGS. 5A-9 illustrate various processes for controlling network applications. The processes described herein are illustrated as collections of blocks in logical flow diagrams, which represent a sequence of operations, some or all of which may be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation, unless specifically noted. Any number of the described blocks may be combined in any order and/or in parallel to implement the process, or alternative processes, and not all of the blocks need be executed.

Figure 5A:
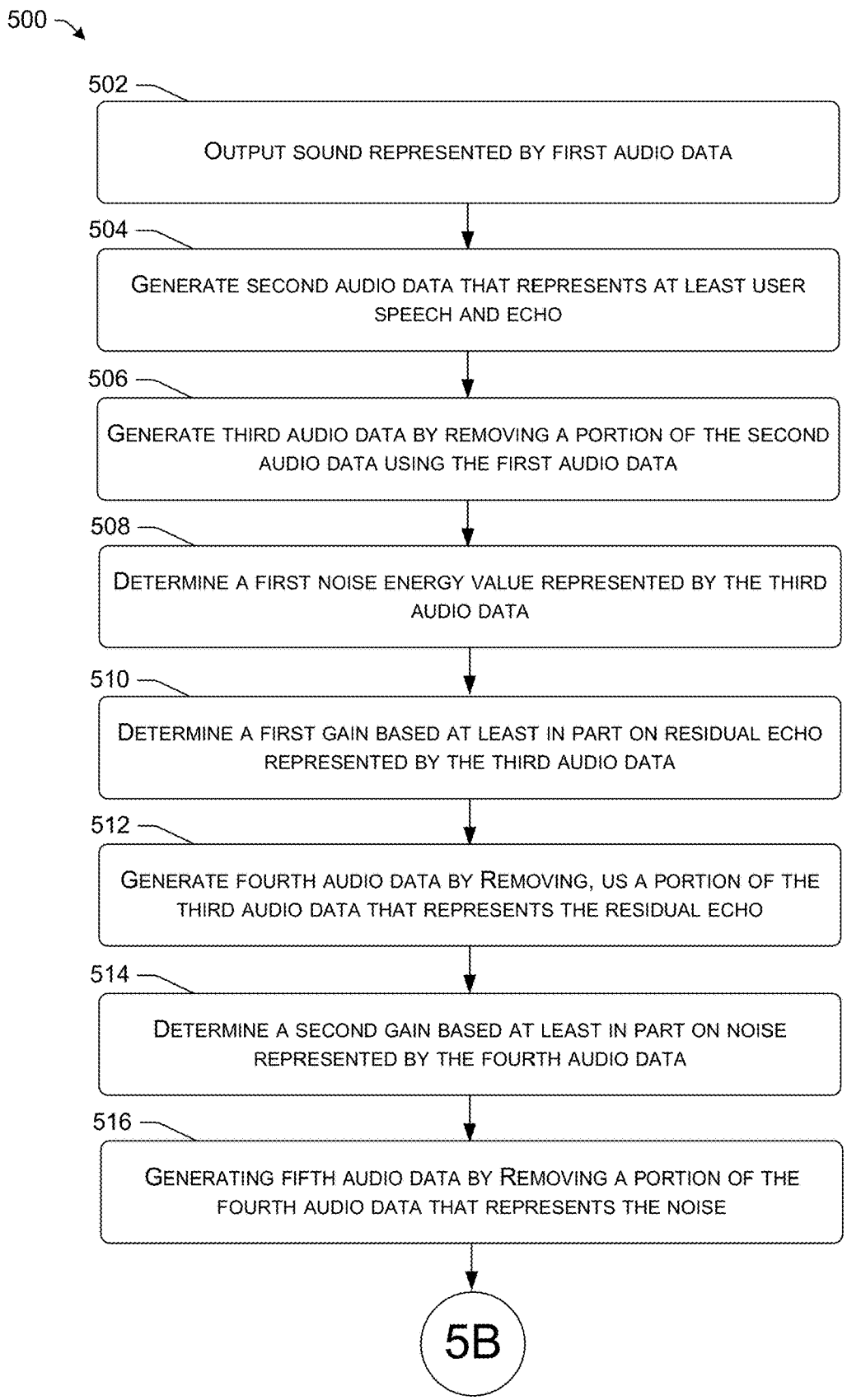
FIGS. 5A-5B illustrates an example process of processing an audio data using an audio processing pipeline.
Figure 5B:
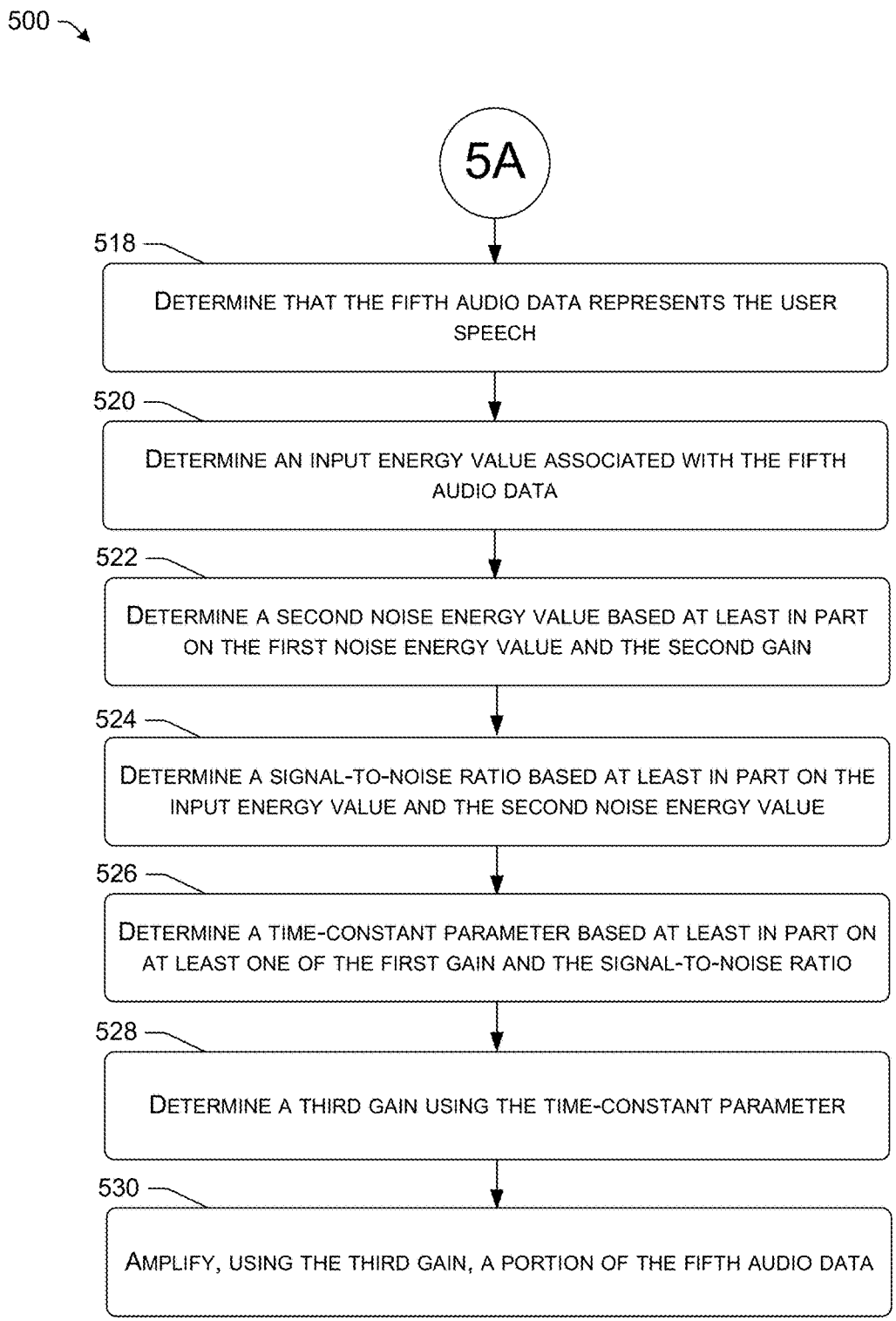

FIGS. 5A-5B illustrates an example process 500 of processing audio data using an audio processing pipeline. At 502, the process 500 may include outputting audio represented by first audio data. For instance, the electronic device 102 may receive the first audio data from an additional electronic device, such as a remote system. The electronic device 102 may then output, using loudspeaker(s), the audio represented by the first audio data. In some instances, the audio represents user speech from a far-end user.

At 504, the process 500 may include generating second audio data that represents at least user speech and echo. For instance, the electronic device 102 may generate, using microphone(s), the second audio data that represents the user speech and the echo. In some instances, the echo may include at least a portion of the audio being output by the loudspeaker(s).

At 506, the process 500 may include generating third audio data by removing a portion of the second audio data using the first audio data. For instance, the electronic device 102 may generate the third audio data by removing the portion of the second audio data using the first audio data. In some instances, to remove the portion of the second audio data, the electronic device 102 may filter and/or delay the first audio data such that the first audio data resembles the second audio data. The electronic device may then remove (e.g., subtract) the filtered first audio data from the second audio data. This may remove the portion of the second audio data, which represents at least a portion of the echo.

At 508, the process 500 may include determining a first noise energy value associated with the third audio data. For instance, the electronic device 102 may determine the first noise energy value associated with the third audio data.

At 510, the process 500 may include determining a first gain based at least in part on residual echo represented by the third audio data. For example, the electronic device 102 may determine the first gain based at least in part on the residual echo represented by the third audio data. In some instances, the electronic device 102 may determine the first gain based at least in part on an estimate of the residual echo and an energy value of the third audio data. In some instances, the electronic device 102 may determine a respective gain for one or more subbands of an audio data that represents the third audio data. The electronic device 102 may then determine the first gain using the respective gains. For example, the electronic device 102 may determine the first gain as the average of the respective gains.

At 512, the process 500 may include generating fourth audio data by removing a portion of the third audio data that represents the residual echo. For instance, the electronic device 102 may generate the fourth audio data by removing (e.g., suppressing), using the first gain, the portion of the third audio data that represents the residual echo. In some instances, to generate the fourth audio data, the electronic device 102 may remove, using the respective gains, portion(s) of the subbands of the third audio data.

At 514, the process 500 may include determining a second gain based at least in part on noise represented by the fourth audio data. For instance, the electronic device 102 may determine the second gain based at least in part on the noise represented by the fourth audio data. In some instances, the electronic device 102 determines the second gain using the first noise energy value.

At 516, the process 500 may include generating fifth audio data by removing a portion of the fourth audio data that represents the noise. For instance, the electronic device 102 may remove, using the second gain, the portion of the fourth audio data that represents the noise.

At 518, the process 500 may include determining that the fifth audio data represents the user speech. For instance, the electronic device 102 may determine that the fifth audio data represents the user speech. In some instances, based on determining that fifth audio data represents the user speech, an AGC of the electronic device 102 may operate in a first mode (e.g., an active mode).

At 520, the process 500 may include determining an input energy value associated with the fifth audio data. For instance, the electronic device 102 may determine the input energy value associated with the fifth audio data.

At 522, the process 500 may include determining a second noise energy value based at least in part on the first noise energy value and the second gain. For instance, the electronic device 102 may determine the second noise energy value based at least in part on the first noise energy value and the second gain. As such, the second noise energy value may include the first noise energy value minus the noise that was removed in order to generate the fifth audio data. In other instances, the electronic device 102 may also determine the second noise energy value by analyzing the fifth audio data.

At 524 the process 500 may include determining a signal-to-noise ratio based at least in part on the input energy value and the second noise energy value. For instance, the electronic device 102 may determine the SNR by taking a ratio of the input energy value to the second noise energy value.

At 526, the process 500 may include determining a time-constant parameter based at least in part on at least one of the first gain or the signal-to-noise ratio. For instance, the electronic device 102 may determine the time-constant parameter based at least in part on at least one of the first gain or the signal-to-noise ratio. In some instances, to determine the time-constant parameter, the electronic device 102 may determine a first confidence level using the first gain and/or a second confidence level using the SNR. Additionally, the electronic device 102 may determine an initial time-constant parameter associated with determining input energy values and/or updating AGC gains. The electronic device 102 may then determine the time-constant parameter using the initial time-constant parameter, the first confidence level, and/or the second confidence level. For example, the electronic device 102 may multiply the initial time-constant parameter by the at least one of the first confidence level or the second confidence level.

At 528, the process 500 may include determining a third gain using the time-constant parameter. For instance, the electronic device 102 may determine the third gain using the time-constant parameter. In some instances, such as then the time-constant parameter is associated with determining input energy values, the electronic device 102 may determine an input energy value of the fifth audio data using the time-constant parameter. The electronic device 102 may then determine the third gain using the determined input energy value and a target output energy value. In some instances, such as when the time-constant parameter is associated with updated the AGC gains, the electronic device 102 may determine the third gain by updating a previous AGC gain using the time-constant parameter.

At 530, the process 500 may include amplifying, using the third gain, a portion of the fifth audio data. For instance, the electronic device 102 may amplify, using the third gain, the portion of the fifth audio data. In some instances, the amplifying of the fifth audio data may cause the output energy value of the fifth audio data to be near the target output energy value. In some instances, the electronic device 102 may then send the fifth audio data, as amplified, to at least one other electronic device.

Figure 6:
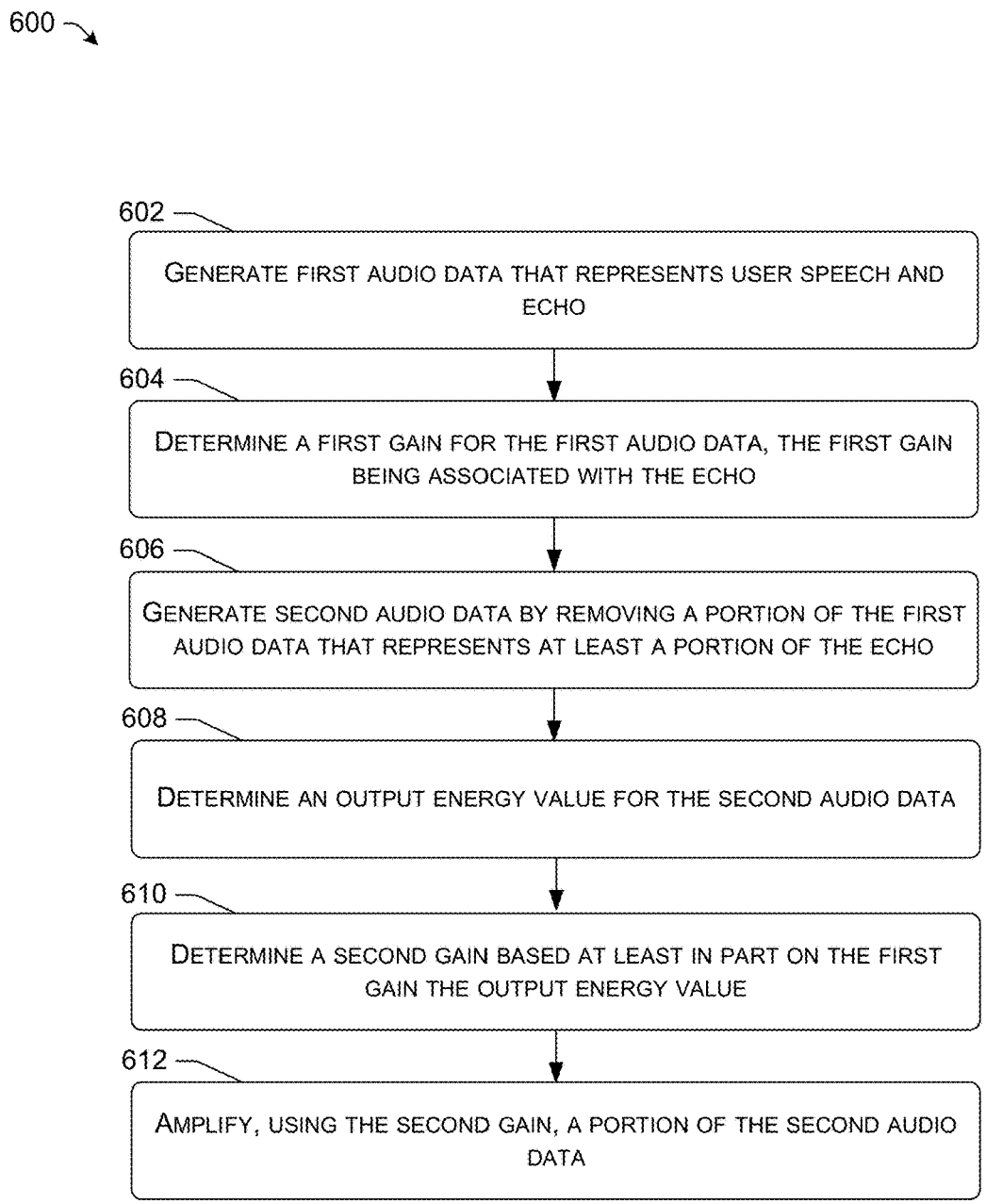
FIG. 6 is an example process for determining a gain for an audio data using information from an echo suppressor.

FIG. 6 is an example process 600 for determining a gain for an audio data using information from an echo suppressor. At 602, the process 600 may include generating first audio data that represents user speech and echo. For instance, the electronic device 102 may generate, using microphone(s), the first audio data that represents the user speech and the echo. In some instances, the echo may include at least a portion of audio being output by the loudspeaker(s) of the electronic device 102.

At 604, the process 600 may include determining a first gain for the first audio data, the first gain being associated with the echo. For instance, the electronic device 102 may determine the first gain for the first audio data. In some instance, the first gain may be associated canceling and/or suppressing at least a portion of the echo from the first audio data. For instance, the first gain may be associated with suppressing residual echo from the first audio data after an AEC processed the first audio data using a reference audio data. In some instances, the first gain may include respective gain(s) associated with subband(s) of the first audio data.

At 606, the process 600 may include generating second audio data by removing a portion of the first audio data that represents at least a portion of the echo. For instance, the electronic device 102 may generate the second audio data by removing, using the first gain, the portion of the first audio data. In some instances, the portion of the first audio data may represent at least a portion of the echo. In some instances, to remove the first portion of the first audio data, the electronic device 102 may remove, using the respective gain(s), portion(s) of the subband(s) of the first audio data.

At 608, the process 600 may include determining an output energy value for the second audio data. For instance, the electronic device 102 may determine the output energy value for the second audio data. In some instances, the electronic device 102 may determine the output energy value as an average energy value for the second audio data. In some instance, the electronic device 102 may determine the output energy value as a maximum energy value of the second audio data. Still, in some instances, the electronic device may determine the output energy value as the median energy value of the second audio data.

At 610, the process 600 may include determining a second gain based at least in part on the first gain and the output energy value. For instance, the electronic device 102 may determine the second gain based at least in part on the first gain and the output energy value. In some instances, to determine the second gain, the electronic device 102 may determine a time-constant parameter associated with determining input energy values using the first gain. The electronic device 102 may then determine an input energy value for the second audio data using the time-constant parameter. Additionally, the electronic device 102 may determine the second gain using the input energy value and the output energy value. For example, the electronic device 102 may determine the second gain as a difference between the output energy value and the input energy value.

In some instances, to determine the second gain, the electronic device 102 may determine a time-constant parameter associated with updating gains using the first gain. The electronic device 102 may then determine the second gain by updating a current gain using the time-constant parameter.

Still, in some instances, to determine the second gain, the electronic device 102 may determine that the second audio data represents user speech and determine whether the first gain satisfies a threshold. Based on determining that the first gain satisfies the threshold, electronic device may then determine to operate in a first mode (e.g., an attack mode). While operating in the first mode, the electronic device 102 may determine the second gain by increasing or decreasing a current gain being applied to the second audio data. However, based on determining that the first gain does not satisfy the threshold, the electronic device 102 may operate in a second mode (e.g., a release mode). While operating in the second mode, the electronic device 102 may decrease the current gain being applied to the second audio data.

At 612, the process 600 may include amplifying, using the second gain, a portion of the second audio data. For instance, the electronic device 102 may amplify, using the second gain, the portion of the second audio data. In some instances, the amplifying of the second audio data may cause the actual output energy value of the second audio data to be near the determined output energy value. In some instances, the electronic device 102 may then send the second audio data, as amplified, to at least one other electronic device.

Figure 7:
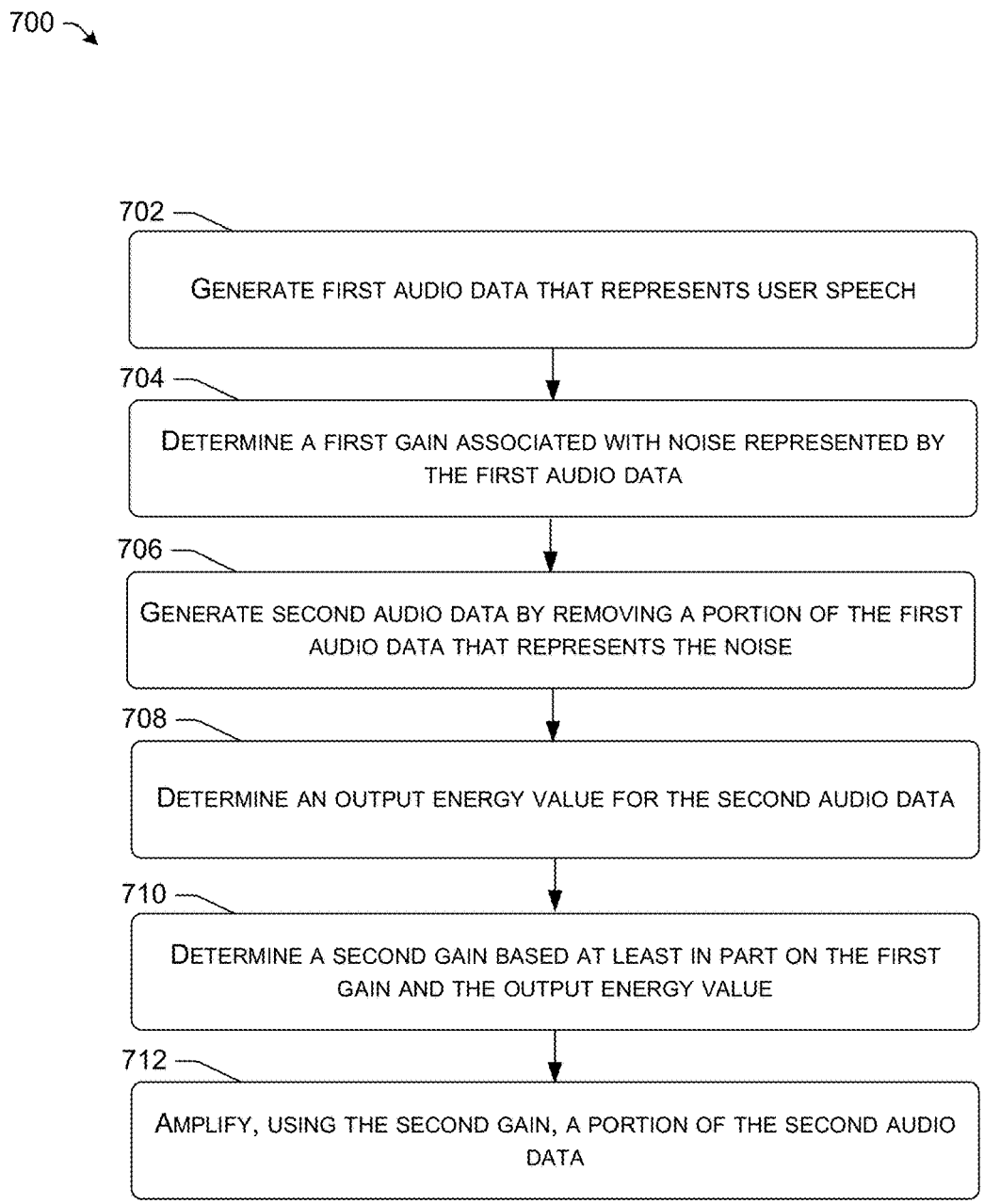
FIG. 7 is an example process for determining a gain for an audio data using information associated with noise.

FIG. 7 is an example process 700 for determining a gain for an audio data using information associated with noise. At 702, the process 700 may include generating first audio data that represents user speech. For instance, the electronic device 102 may generate, using microphone(s), the first audio data that represents the user speech. In some instances, the first audio data may further include noise.

At 704, the process 700 may include determining a first gain associated with noise represented by the first audio data. For instance, the electronic device 102 may determine the first gain associated with the noise represented by the first audio data.

At 706, the process 700 may include generating second audio data by removing a portion of the first audio data that represents the noise. For instance, the electronic device 102 may generate the second audio data by removing, using the first gain, the portion of the first audio data that represents the noise.

At 708, the process 700 may include determining an output energy value for the second audio data. For instance, the electronic device 102 may determine the output energy value for the second audio data. In some instances, the electronic device 102 may determine the output energy value as an average energy value for the second audio data. In some instance, the electronic device 102 may determine the output energy value as a maximum energy value of the second audio data. Still, in some instances, the electronic device may determine the output energy value as the median energy value of the second audio data.

At 710, the process 700 may include determining a second gain based at least in part on the first gain and the output energy value. For instance, the electronic device 102 may determine the second gain based at least in part on the first gain and the output energy value. In some instances, the electronic device 102 may determine a SNR associated with the second audio data using the first gain. For instance, the electronic device 102 may determine an input energy value associated with the second audio data. The electronic device 102 may then determine a noise energy value associated with the second audio data using the first gain. Additionally, the electronic device 102 may then take the ratio of the input energy value to the noise energy value. In some instances, the electronic device 102 may then determine a confidence level (e.g., a speech presence probability) using the SNR level. In some instances, the confidence level may include a value that ranges between 0 to 100 (although other ranges may be used). In such an example, a confidence level that is close to 100 may indicate the presence of the user speech represented by the audio data. Additionally, a confidence level that is close to 0 may indicate the presence of noise in the audio data.

In some instances, to determine the second gain, the electronic device 102 may determine a time-constant parameter associated with determining input energy values using the first gain, the SNR, and/or the confidence level. The electronic device 102 may then determine an input energy value for the second audio data using the time-constant parameter. Additionally, the electronic device 102 may determine the second gain using the input energy value and the output energy value. For example, the electronic device 102 may determine the second gain as a difference between the output energy value and the input energy value.

In some instances, to determine the second gain, the electronic device 102 may determine a time-constant parameter associated with updating gains using the first gain, the SNR, and/or the confidence level. The electronic device 102 may then determine the second gain by updating a current gain using the time-constant parameter.

Still, in some instances, to determine the second gain, the electronic device 102 may determine that the second audio data represents user speech and determine whether the first gain, the SNR, and/or the confidence level satisfies a threshold. Based on determining that the first gain, the SNR, and/or the confidence level satisfies the threshold, electronic device may then determine to operate in a first mode (e.g., an attack mode). While operating in the first mode, the electronic device 102 may determine the second gain by increasing or decreasing a current gain being applied to the second audio data. However, based on determining that the first gain, the SNR, and/or the confidence level does not satisfy the threshold, the electronic device 102 may operate in a second mode (e.g., a release mode). While operating in the second mode, the electronic device 102 may decrease the second gain being applied to the second audio data.

At 712, the process 700 may include amplifying, using the second gain, a portion of the second audio data. For instance, the electronic device 102 may amplify, using the second gain, the portion of the second audio data. In some instances, the amplifying of the second audio data may cause the actual output energy value of the second audio data to be near the determined output energy value. In some instances, the electronic device 102 may then send the second audio data, as amplified, to at least one other electronic device.

Figure 8:
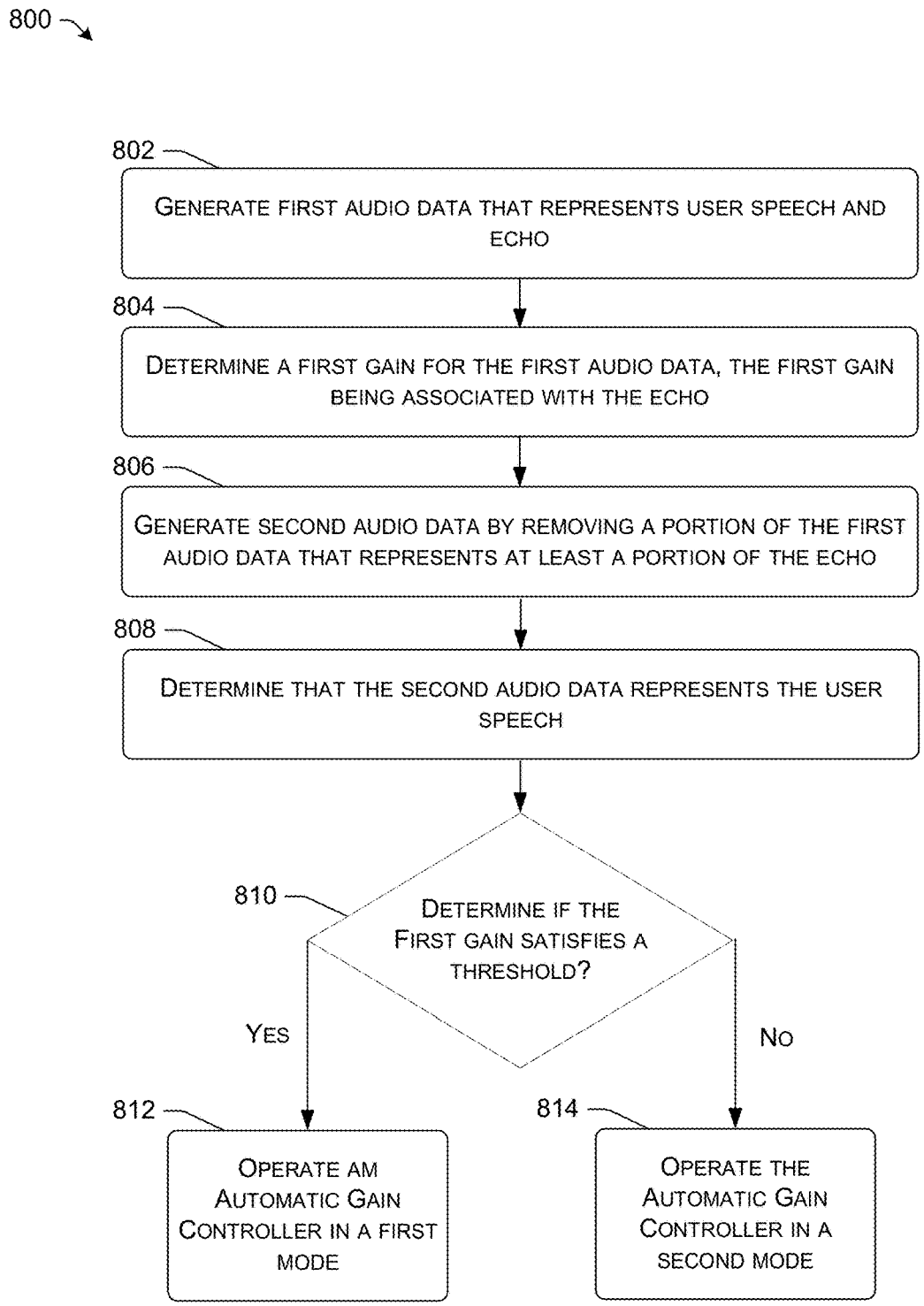
FIG. 8 is a first example process for determining a mode for an automatic gain controller using hard thresholding.

FIG. 8 is a first example process 800 for determining a mode for an automatic gain controller using hard thresholding. At 802, the process 800 may include generating first audio data that represents user speech and echo. For instance, the electronic device 102 may generate, using microphone(s), the first audio data that represents the user speech and the echo. In some instances, the echo may include at least a portion of audio being output by the loudspeaker(s) of the electronic device 102.

At 804, the process 800 may include determining a first gain for the first audio data, the first gain being associated with the echo. For instance, the electronic device 102 may determine the first gain for the first audio data. In some instance, the first gain may be associated canceling and/or suppressing at least a portion of the echo from the first audio data. For instance, the first gain may be associated with suppressing residual echo from the first audio data after an AEC processed the first audio data using a reference audio data. In some instances, the first gain may include respective gain(s) associated with subband(s) of an audio data that represents the first audio data.

At 806, the process 800 may include generating second audio data by removing a portion of the first audio data that represents at least a portion of the echo. For instance, the electronic device 102 may generate the second audio data by removing, using the first gain, the portion of the first audio data. In some instances, the portion of the first audio data may represent at least a portion of the echo. In some instances, to remove the first portion of the first audio data, the electronic device 102 may remove, using the respective gain(s), portion(s) of the subband(s) of the first audio data.

At 808, the process 800 may include determining that the second audio data represents the user speech. For instance, the electronic device 102 may determine that the second audio data represents the user speech. In some instances, the electronic device 102 determines that the second audio data represents the user speech based at least in part on an energy value of the second audio data.

At 810, the process 800 may include determining if the first gain satisfies a threshold. For instance, the electronic device 102 may determine if the first gain satisfies the threshold. The threshold may include, but is not limited to, 0.75, 0.90, 0.95, and/or any other threshold. In some instances, the electronic device 102 may first determine a confidence level using the first gain. In such instances, the electronic device 102 may then determine if the confidence level satisfies the threshold. Additionally, the threshold may include, but is not limited to, 75%, 90%, 95%, and/or any other threshold.

If, at 810 the first gain satisfies the threshold, then at 812, the process 800 may include operating an automatic gain controller in a first mode. For instance, if the electronic device 102 determines that the first gain satisfies the threshold, then the AGC of the electronic device 102 may operate in the first mode (e.g., an attack mode). In some instances, while operating in the first mode, the AGC may update the AGC gains by increasing or decreasing the AGC gains being applied to the second audio data.

However, if at 810 the first gain does not satisfy the threshold, then at 814, the process 800 may include operating the automatic gain controller in a second mode. For instance, if the electronic device 102 determines that the first gain does not satisfy the threshold, then the AGC of the electronic device 102 may operate in the second mode (e.g., a release mode). In some instances, while operating in the second mode, the AGC may decrease the AGC gains being applied to the audio data. In some instances, while operating in the second mode, the AGC may refrain from updating the AGC gains.

Figure 9:
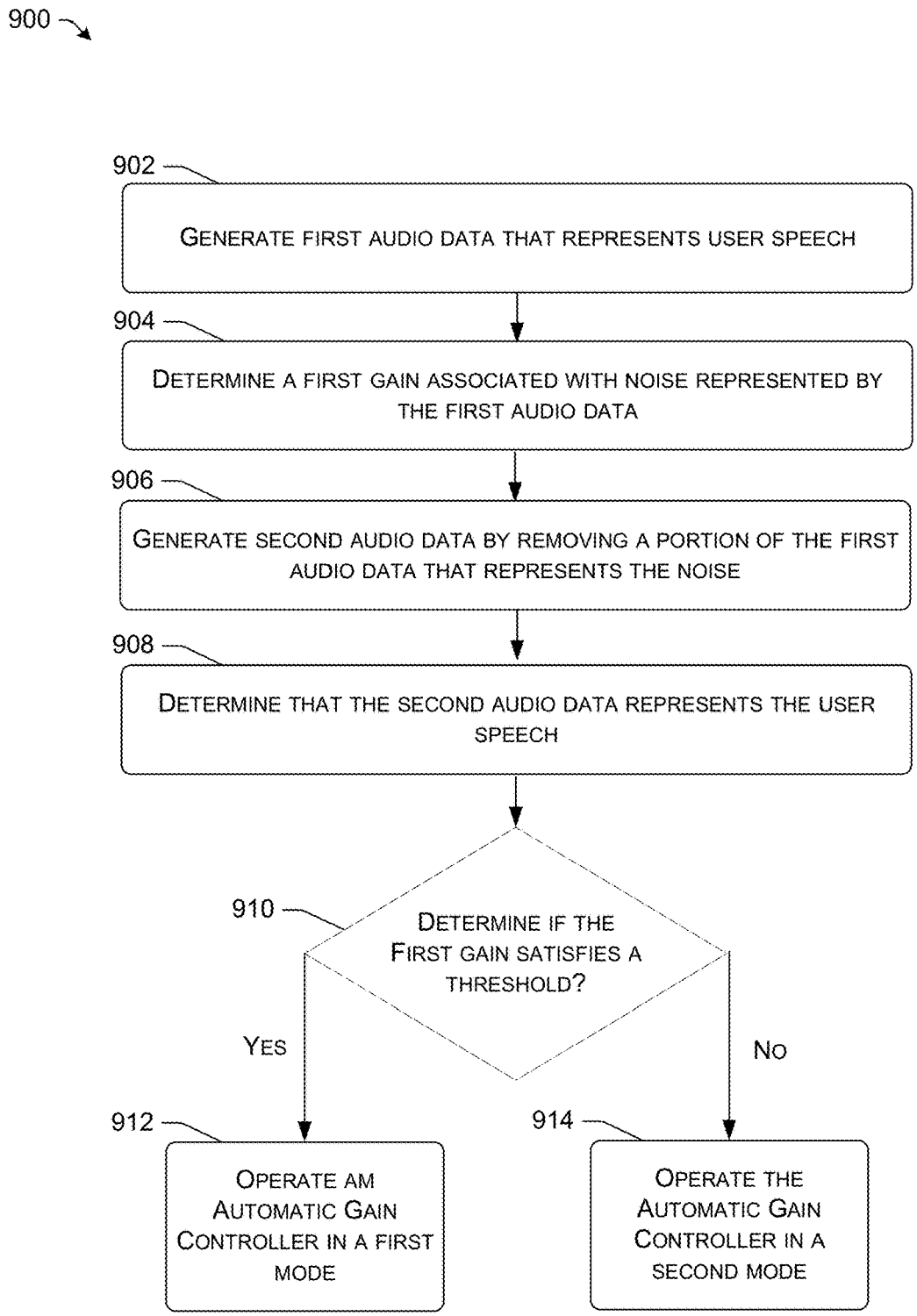
FIG. 9 is a second example process for determining a mode for an automatic gain controller using hard thresholding.

FIG. 9 is a second example process 900 for determining a mode for an automatic gain controller using hard thresholding. At 902, the process 900 may include generating first audio data that represents user speech. For instance, the electronic device 102 may generate, using microphone(s), the first audio data that represents the user speech. In some instances, the first audio data may further include noise.

At 904, the process 900 may include determining a first gain associated with noise represented by the first audio data. For instance, the electronic device 102 may determine the first gain associated with the noise represented by the first audio data.

At 906, the process 900 may include generating second audio data by removing a portion of the first audio data that represents the noise. For instance, the electronic device 102 may generate the second audio data by removing, using the first gain, the portion of the first audio data that represents the noise.

At 908, the process 900 may include determining that the second audio data represents the user speech. For instance, the electronic device 102 may determine that the second audio data represents the user speech. In some instances, the electronic device 102 determines that the second audio data represents the user speech based at least in part on an energy value of the second audio data.

At 910, the process 900 may include determining if the first gain satisfies a threshold. For instance, the electronic device 102 may determine if the first gain satisfies the threshold. In some instances, to make the determination, the electronic device 102 may determine a SNR associated with the second audio data using the first gain. For instance, the electronic device 102 may determine an input energy value associated with the second audio data. The electronic device 102 may then determine a noise energy value associated with the second audio data using the first gain. Additionally, the electronic device 102 may then take the ratio of the input energy value to the noise energy value. The electronic device 102 may then determine if the SNR satisfies a threshold.

In some instances, to make the determination, the electronic device 102 may then determine a confidence level (e.g., a speech presence probability) using the SNR level. In some instances, the confidence level may include a value that ranges between 0 to 100 (although other ranges may be used). In such an example, a confidence level that is close to 100 may indicate the presence of the user speech represented by the audio data. Additionally, a confidence level that is close to 0 may indicate the presence of noise in the audio data. The electronic device 102 may then determine if the confidence level satisfies the threshold.

If, at 910 the first gain satisfies the threshold, then at 912, the process 900 may include operating an automatic gain controller in a first mode. For instance, if the electronic device 102 determines that the first gain satisfies the threshold, then the AGC of the electronic device 102 may operate in the first mode (e.g., an attack mode). In some instances, while operating in the first mode, the AGC may update the AGC gains by increasing or decreasing the AGC gains being applied to the second audio data.

However, if at 910 the first gain does not satisfy the threshold, then at 914, the process 900 may include operating the automatic gain controller in a second mode. For instance, if the electronic device 102 determines that the first gain does not satisfy the threshold, then the AGC of the electronic device 102 may operate in the second mode (e.g., a release mode). In some instances, while operating in the second mode, the AGC may decrease the AGC gains being applied to the audio data. In some instances, while operating in the second mode, the AGC may refrain from updating the AGC gains.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims.

What is claimed is:

1. A device comprising:
    at least one loudspeaker operable to output audio corresponding to first audio data;
    at least one microphone operable to generate second audio data representing user speech and echo data that includes a portion of the audio captured by the at least one microphone;
    an acoustic echo canceler operable to:
        identify, using the first audio data, a portion of the second audio data that represents echo;
        generate third audio data by removing the portion of the second audio data that represents the echo;
    a noise estimator operable to determine a first noise energy value associated with the third audio data;
    a residual echo suppressor operable to:
        determine a first gain based at least in part on residual echo represented by the third audio data; and
        generate fourth audio data by removing a portion of the third audio data that represents a portion of the residual echo;
    a noise reductor operator to:
        determine a second gain based at least in part a second noise energy value associated with the fourth audio data; and
        generate a fifth audio data by removing a portion of the fourth audio data, the portion of the fourth audio data being associated with the second noise energy value;
    a voice activity detector operable to determine that the fifth audio data represents the user speech; and
    an automatic gain controller operable to:
        determine an input energy value associated with the fifth audio data;
        determine a third noise energy value by subtracting the first noise energy value by the second noise energy value;
        determine a signal-to-noise ratio associated with the fifth audio data by taking a ratio of the input energy value to the third noise energy value;
        determine a time-constant parameter based at least in part on the first gain and the signal-to-noise ratio, the time-constant parameter setting an amount of averaging that is performed on the fifth audio data to determine a third gain;
        determine the third gain using the time-constant parameter; and
        amplify, using the third gain, a portion of the fifth audio data.

2. The device as recited in claim 1, wherein the automatic gain controller is further operable to:
    determine an additional time-constant parameter associated with determining a fourth gain;
    determine a first confidence value using the first gain, the first confidence value indicating a likelihood that the third audio data represented the residual echo; and
    determine a second confidence value using the signal-to-noise ratio, the second confidence value indicating a likelihood that the fifth audio data represents the user speech, wherein to determine the time-constant parameter comprises multiply the additional time-constant parameter by at least one of the first confidence value or the second confidence value.

3. The device as recited in claim 1, wherein the time-constant parameter is a first time-constant parameter, and wherein the automatic gain controller is further operable to:
determine a second time-constant parameter associated with determining the input energy value;
determine a confidence value using the first gain, the confidence value indicating a likelihood that the third audio data represented the residual echo; and
determine a third time-constant parameter by multiplying the second time-constant parameter by the confidence value,
wherein to determine the input signal level associated with the fifth audio data comprises determine using the second time-constant parameter, the input energy value associated with the fifth audio data.

4. A method comprising:
generating first audio data that represents user speech and echo;
determining a first gain value for the first audio data, the first gain value being associated with at least a portion of the echo;
generating second audio data by removing a portion of the first audio data that represents the at least the portion of the echo;
determining an output energy value for the second audio data;
determining a second gain value for the second audio data based at least in part on the first gain value and the output energy value; and
amplifying, using the second gain value, a portion of the second audio data.

5. The method as recited in claim 4, further comprising:
determining a first time-constant value;
determining a third gain value using the first time-constant value and the output signal energy; and
determining a second time-constant value based at least in part on the first time-constant value and the first gain value,
wherein determining the second gain value comprises determining the second gain value using the second time-constant value and the output energy value.

6. The method as recited in claim 4, further comprising:
determining a first time-constant value;
determining that the second audio data does not represent the user speech; and
determining a second time-constant value based at least in part on the first time-constant value and the first gain value, the second time-constant value being lower than the first time-constant value,
wherein determining the second gain value comprises determining the second gain value using the second time-constant value and the output energy value.

7. The method as recited in claim 4, further comprising:
determining a third gain value for the second audio data based at least in part on the output energy value; and
determining that the first gain value satisfies a threshold;
wherein determining of the second gain value comprises determining, based at least in part on the first gain value satisfying the threshold, the second gain value for the second audio data by increasing the third gain value.

8. The method as recited in claim 4, further comprising:
determining a third gain value for the second audio data based at least in part on the output energy value; and determining that the first gain value is below a threshold;
wherein determining of the second gain value comprises determining, based at least in part on the first gain being below the threshold, the second gain value for the second audio data by decreasing the third gain value.

9. The method as recited in claim 4, further comprising:
determining a first time-constant value;
determining, using the first time-constant value, a first input energy value associated with the second audio data;
determining a second time-constant value based at least in part on the first time-constant value and the first gain value; and
determining, using the second time-constant value, a second input energy value associated with the second audio data,
wherein determining of the second gain value is further based at least in part on the second input energy value.

10. The method as recited in claim 4, wherein determining the first gain value comprises:
determining a third gain value for a first subb and of the first audio data, the third gain value being associated with first residual echo represented by the first subband;
removing at least a portion of the first subband that represents the first residual echo;
determining a fourth gain value for a second subband of the first audio data, the fourth gain value being associated with second residual echo represented by the second subband;
removing at least a portion of the second subband that represents the second residual echo; and
determining the first gain value based at least in part on the third gain value and the fourth gain value.

11. The method as recited in claim 4, further comprising:
determining that the second audio data represents the user speech,
wherein determining the second gain value is further based at least in part on the determining that the second audio data represents the user speech.

12. The method as recited in claim 4, further comprising:
determining a signal-to-noise ratio associated with the second audio data,
wherein the determining of the second gain value is further based at least in part on the signal-to-noise ratio.

13. The method as recited in claim 4, wherein generating the second audio data by removing the portion of the first audio data that represents the at least the portion of the echo comprises generating the second audio data by removing the portion of the first audio data using the first gain value that is associated with the at least the portion of the echo.

14. A device comprising:
one or more processors; and
one or more computer-readable media storing instructions that, when executed by the one or more processors, cause the one or more processors to perform operations comprising:
generating first audio data that represents at least user speech;
determining a first gain value associated with noise represented by the first audio data;
generating second audio data by removing a portion of the first audio data that represents the noise;
determining an output energy value for the second audio data;
determining a second gain value for the second audio data based at least in part on the first gain value and the output energy value; and amplifying, using the second gain value, a portion of the second audio data.

15. The device as recited in claim 14, the operations further comprising:
    determining an input energy value of the second audio data; and
    determining a signal-to-noise ratio based at least in part on the input energy value and the first gain value,
    wherein determining the second gain value for the second audio data is based at least in part on the signal-to-noise ratio and the output energy value.

16. The device as recited in claim 14, the operations further comprising:
    determining a first time-constant value;
    determining a third gain value using the first time-constant value; and
    determining a second time-constant value based at least in part on the first time-constant value and the first gain value,
    wherein determining the second gain value comprises determining the second gain value for the second audio data using the second time-constant value and the output energy value.

17. The device as recited in claim 14, the operations further comprising:
    determining a third gain value for the second audio data based at least in part on the output energy value;
    determining a confidence value using the first gain value; and
    determining that the confidence value satisfies a threshold;
    wherein determining the second gain value comprises determining, based at least in part on the confidence value satisfying the threshold, the second gain value by increasing the third gain value.

18. The device as recited in claim 14, the operations further comprising:
    determining a first time-constant value;
    determining, using the first time-constant value, a first input energy value associated with the second audio data;
    determining a second time-constant value based at least in part on the first time-constant value and the first gain value; and
    determining, using the second time-constant value, a second input energy value associated with the second audio data,
    wherein determining the second gain value is further based at least in part on the second input energy value.

19. The device as recited in claim 14, the operations further comprising:
    determining, based at least in part on the first gain value, a noise energy value associated with the second audio data;
    determining an input energy value associated with the second audio data; and
    determining a signal-to-noise ration associated with the second audio data using the noise energy value and the input energy value,
    wherein determining the second gain value is based at least in part on the signal-to-noise ratio.

20. The device as recited in claim 14, the operations further comprising:
    generating third audio data, the third audio data representing at least the user speech and echo; and
    determining a third gain value for the third audio data, the third gain value being associated with at least a portion of the echo,
    wherein generating first audio data comprises generating the first audio data by removing a portion of the third audio data that represents the at least the portion of the echo, and wherein determining the second gain value is further based at least in part on the third gain value.

* * * * *

UNITED STATES PATENT AND TRADEMARK OFFICE
CERTIFICATE OF CORRECTION

PATENT NO. : 10,867,617 B1
APPLICATION NO. : 16/215217
DATED : December 15, 2020
INVENTOR(S) : Carlos Renato Nakagawa et al.

It is certified that error appears in the above-identified patent and that said Letters Patent is hereby corrected as shown below:

In the Claims

Column 26, Line 21, change "subb and" to --subband--.

Signed and Sealed this
Fifth Day of January, 2021

Andrei Iancu
*Director of the United States Patent and Trademark Office*